(12) United States Patent
Nomura

(10) Patent No.: US 11,411,030 B2
(45) Date of Patent: Aug. 9, 2022

(54) IMAGING ELEMENT AND ELECTRONIC APPARATUS

(71) Applicant: SONY SEMICONDUCTOR SOLUTIONS CORPORATION, Kanagawa (JP)

(72) Inventor: Hirotoshi Nomura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/484,985

(22) PCT Filed: Feb. 2, 2018

(86) PCT No.: PCT/JP2018/003505
§ 371 (c)(1),
(2) Date: Aug. 9, 2019

(87) PCT Pub. No.: WO2018/150902
PCT Pub. Date: Aug. 23, 2018

(65) Prior Publication Data
US 2020/0027913 A1      Jan. 23, 2020

(30) Foreign Application Priority Data
Feb. 17, 2017   (JP) .............................. JP2017-027533

(51) Int. Cl.
*H01L 27/146*      (2006.01)
(52) U.S. Cl.
CPC .... *H01L 27/14623* (2013.01); *H01L 27/1463* (2013.01); *H01L 27/14629* (2013.01)
(58) Field of Classification Search
CPC ........... H01L 27/1463; H01L 27/14629; H01L 27/14627; H01L 27/14625;
(Continued)

(56) References Cited

U.S. PATENT DOCUMENTS

2006/0278896 A1* 12/2006 Inoue ................ H01L 27/14623
                                                       257/215
2007/0215912 A1*  9/2007 Kido ................. H01L 27/14627
                                                       257/257
(Continued)

FOREIGN PATENT DOCUMENTS

JP      2015-060855       3/2015
JP      2015-070070       4/2015
(Continued)

OTHER PUBLICATIONS

International Search Report prepared by the Japan Patent Office dated Mar. 12, 2018, for International Application No. PCT/JP2018/003505.

(Continued)

*Primary Examiner* — Syed I Gheyas
(74) *Attorney, Agent, or Firm* — Sheridan Ross P.C.

(57) ABSTRACT

The present disclosure relates to an imaging element and an electronic apparatus configured to achieve higher-resolution image taking. The imaging element includes: a photoelectric conversion portion provided in a semiconductor substrate for each pixel that performs photoelectric conversion on light that enters through a filter layer; an element isolation portion configured to separate the photoelectric conversion portions of adjacent pixels; and an inter-pixel light shielding portion disposed between the pixels in a layer and provided between the semiconductor substrate and the filter layer and separated from a light receiving surface of the semiconductor substrate by a predetermined interval. Moreover, an interval between the light receiving surface of the semiconductor substrate and a tip end surface of the inter-pixel light shielding portion is smaller than a width of the tip end surface of the inter-pixel light shielding portion. The present (Continued)

technology is applicable to back-illuminated CMOS image sensors, for example.

20 Claims, 20 Drawing Sheets

(58) Field of Classification Search
CPC ......... H01L 27/14623; H01L 27/14621; H01L 27/14601
See application file for complete search history.

(56) References Cited

U.S. PATENT DOCUMENTS

| | | | |
|---|---|---|---|
| 2014/0054662 A1* | 2/2014 | Yanagita | H01L 27/1463 257/291 |
| 2014/0151531 A1* | 6/2014 | Yamashita | H01L 27/14627 250/208.1 |
| 2014/0218572 A1* | 8/2014 | Ootsuka | H01L 27/14627 348/280 |
| 2015/0076643 A1 | 3/2015 | Kikuchi | |
| 2015/0091121 A1* | 4/2015 | Manda | H01L 27/14636 257/443 |
| 2016/0049439 A1 | 2/2016 | Yanagita et al. | |

FOREIGN PATENT DOCUMENTS

| | | |
|---|---|---|
| JP | 2015-164210 | 9/2015 |
| JP | 2015-228510 | 12/2015 |
| JP | 2016-100347 | 5/2016 |
| WO | WO 2014/157579 | 2/2017 |

OTHER PUBLICATIONS

Official Action (with English translation) for Japan Patent Application No. 2018-568106, dated Jan. 18, 2022, 10 pages.

\* cited by examiner

IMAGING ELEMENT AND ELECTRONIC APPARATUS

CROSS REFERENCE TO RELATED APPLICATIONS

This application is a national stage application under 35 U.S.C. 371 and claims the benefit of PCT Application No. PCT/JP2018/003505 having an international filing date of 2 Feb. 2018, which designated the United States, which PCT application claimed the benefit of Japanese Patent Application No. 2017-027533 filed 17 Feb. 2017, the entire disclosures of each of which are incorporated herein by reference.

TECHNICAL FIELD

The present disclosure relates to an imaging element and an electronic apparatus, and in particular, to an imaging element and an electronic apparatus configured to achieve higher-resolution image taking.

BACKGROUND ART

Hitherto, with regard to solid-state imaging elements such as a CCD (Charge Coupled Device) or a CMOS (Complementary Metal Oxide Semiconductor) image sensors, it is important to reduce incident light to an appropriate amount, and at the same time, to prevent color mixing that occurs between different color pixels.

For example, PTL 1 discloses a solid-state imaging device in which, between a semiconductor substrate and a color filter layer, inter-pixel light shielding portions each of which is provided in a boundary portion between pixels adjacent to each other are each biasedly located in the boundary portion of the combination of different color pixels.

CITATION LIST

Patent Literature

[PTL 1]
Japanese Patent Laid-open No. 2012-204449

SUMMARY

Technical Problem

Incidentally, in a configuration of the solid-state imaging device disclosed in PTL 1 described above, it is difficult to prevent color mixing that occurs due to, for example, light diffracted or reflected in a portion lower than the inter-pixel light shielding portion. It has therefore been demanded to enhance an effect of preventing the occurrence of color mixing with respect to the related art, thereby achieve higher-resolution image taking.

The present disclosure has been made in view of such circumstances and achieves higher-resolution image taking.

Solution to Problem

According to an aspect of the present disclosure, there is provided an imaging element including: a photoelectric conversion portion that is provided in a semiconductor substrate for each of pixels and performs photoelectric conversion on light that enters through a filter layer allowing light in a predetermined wavelength range to pass therethrough; an element isolation portion configured to separate the photoelectric conversion portions of the pixels adjacent to each other in the semiconductor substrate; and an inter-pixel light shielding portion that is disposed between the pixels in a layer that is provided between the semiconductor substrate and the filter layer so as to be separated from a light receiving surface of the semiconductor substrate by a predetermined interval, in which an interval between the light receiving surface of the semiconductor substrate and a tip end surface of the inter-pixel light shielding portion is smaller than a width of the tip end surface of the inter-pixel light shielding portion.

According to an aspect of the present disclosure, there is provided an electronic apparatus including an imaging element including a photoelectric conversion portion that is provided in a semiconductor substrate for each of pixels and performs photoelectric conversion on light that enters through a filter layer allowing light in a predetermined wavelength range to pass therethrough, an element isolation portion configured to separate the photoelectric conversion portions of the pixels adjacent to each other in the semiconductor substrate, and an inter-pixel light shielding portion that is disposed between the pixels in a layer that is provided between the semiconductor substrate and the filter layer so as to be separated from a light receiving surface of the semiconductor substrate by a predetermined interval, in which an interval between the light receiving surface of the semiconductor substrate and a tip end surface of the inter-pixel light shielding portion is smaller than a width of the tip end surface of the inter-pixel light shielding portion.

According to an aspect of the present disclosure, a photoelectric conversion portion that is provided in a semiconductor substrate for each of pixels performs photoelectric conversion on light that enters through a filter layer allowing light in a predetermined wavelength range to pass therethrough, and an element isolation portion separates the photoelectric conversion portions of the pixels adjacent to each other in the semiconductor substrate. Further, an inter-pixel light shielding portion is disposed between the pixels in a layer that is provided between the semiconductor substrate and the filter layer so as to be separated from a light receiving surface of the semiconductor substrate by a predetermined interval. Moreover, an interval between the light receiving surface of the semiconductor substrate and a tip end surface of the inter-pixel light shielding portion is smaller than a width of the tip end surface of the inter-pixel light shielding portion.

Advantageous Effect of Invention

According to the aspect of the present disclosure, higher-resolution images can be taken.

DESCRIPTION OF EMBODIMENTS

Now, specific embodiments to which the present technology is applied are described in detail with reference to the drawings.

<First Configuration Example of Imaging Element>

Figure 1:
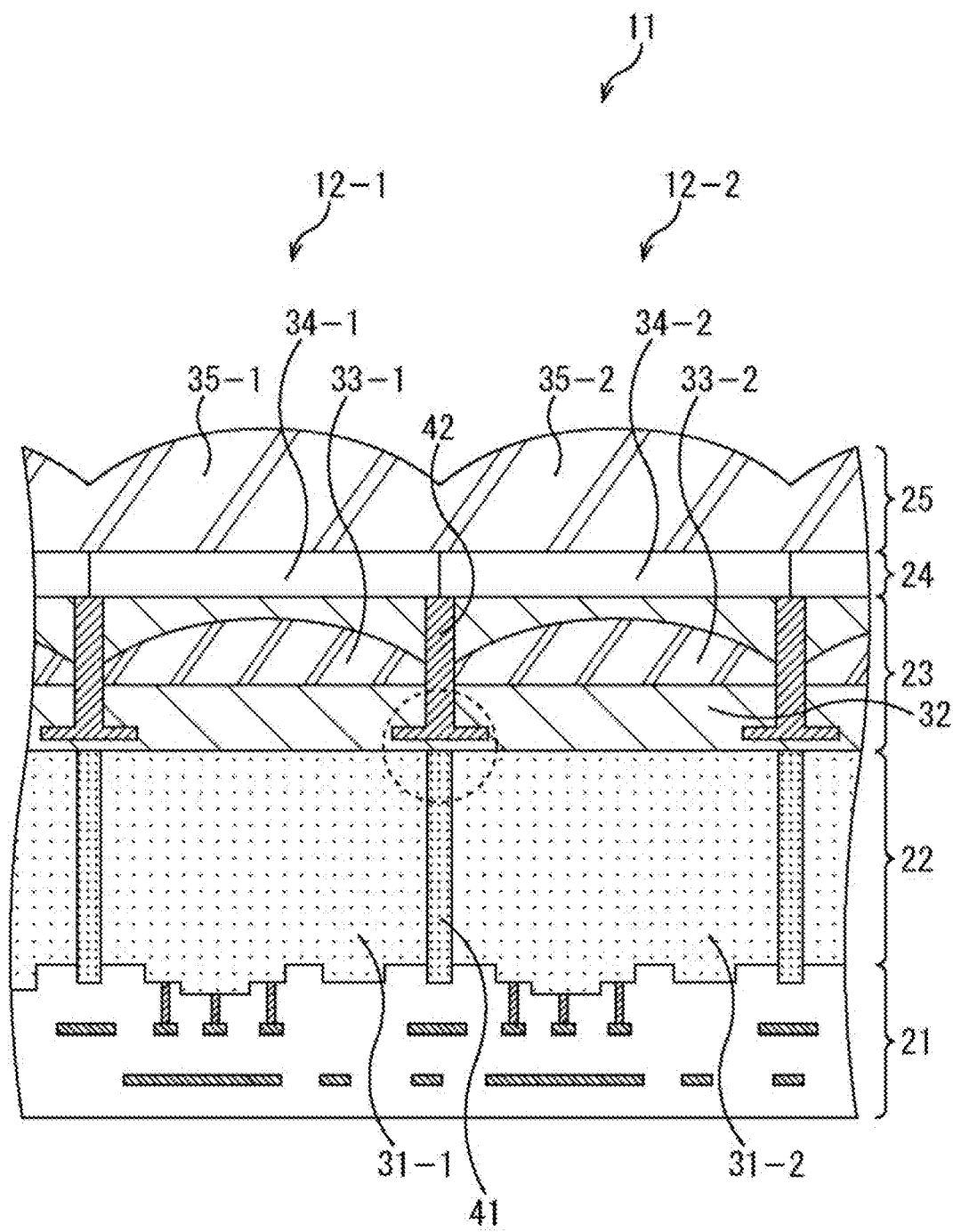
FIG. 1 is a diagram illustrating a configuration example of an imaging element according to a first embodiment to which the present technology is applied.

With reference to FIG. 1, an imaging element according to a first embodiment to which the present technology is applied is described.

FIG. 1 illustrates examples of sectional configurations of two pixels 12-1 and 12-2 of a plurality of pixels 12 that are arranged on a light receiving surface of an imaging element 11 in an array. Note that, in the following, in a case where there is no need to distinguish the pixels 12-1 and 12-2 from each other, the pixels 12-1 and 12-2 are simply referred to as "the pixel 12" as appropriate. The same holds true for each portion of the pixel 12.

As illustrated in FIG. 1, the imaging element 11 includes, in order from the lower side, a wiring layer 21, a semiconductor substrate 22, a planarization film 23, a filter layer 24, and an on-chip lens layer 25 that are stacked. The imaging element 11 is, for example, a back-illuminated CMOS image sensor in which a back surface of the semiconductor substrate 22, which is opposite to the front surface thereof, is irradiated with light. Further, the imaging element 11 includes, for each pixel 12, a photoelectric conversion portion 31, an inner lens 33, color filter 34, and a microlens 35.

The wiring layer 21 includes, in an inter-layer insulating film, wiring for reading out charges from the pixel 12 and wiring for transmitting signals to be supplied to a transistor configured to drive the pixel 12.

The semiconductor substrate 22 includes, for example, a wafer that is a thin slice of monocrystalline silicon. The semiconductor substrate 22 includes, for each pixel 12, the photoelectric conversion portion 31 configured to convert light that enters through the filter layer 24 into charges. Further, the semiconductor substrate 22 includes an element isolation portion 41 between the photoelectric conversion portions 31 of the adjacent pixels 12, so that the photoelectric conversion portions 31 are electrically isolated from each other by the element isolation portion 41. Note that examples of a material that is used as the photoelectric conversion portion 31, that is, a material that converts light into charges, can include silicon (Si), germanium (Ge), CIGS (Copper Indium Gallium Selenide), InGaAs (Indium Gallium Arsenide), and the like.

The planarization film 23 includes the inner lens 33 and an inter-pixel light shielding portion 42 in a transparent resin layer 32 for planarizing the light receiving surface of the semiconductor substrate 22 on which the photoelectric conversion portion 31 receives light. Note that, instead of the transparent resin layer 32, a transparent insulating film or a combination of a transparent insulating film and a resin layer can be used. The inner lens 33 is provided for each pixel 12 and concentrates light that has passed through the filter layer 24 on a center of the photoelectric conversion portion 31. The inter-pixel light shielding portion 42 is provided between the adjacent pixels 12 like the element isolation portion 41, and blocks light that has passed through the filter layer 24 in a diagonal direction to prevent the light from entering another adjacent pixel 12. Examples of the element isolation portion 41 include a metal film that has a light-shielding property and can cut incident light at 20 to 30 degrees or more.

The filter layer 24 includes the planarly arranged color filters 34. The color filter 34 is provided for each pixel 12 and allows light in a wavelength range corresponding to a color of light that is received by the corresponding pixel 12 to pass therethrough.

The on-chip lens layer 25 includes the planarly arranged microlenses 35. The microlens 35 is provided for each pixel 12 and concentrates, for each pixel 12, light with which the imaging element 11 is irradiated.

In the imaging element 11 configured as described above, in the planarization film 23 that is provided between the semiconductor substrate 22 and the filter layer 24, the inter-pixel light shielding portion 42 is disposed to be separated from the light receiving surface of the semiconductor substrate 22 by a predetermined interval. Moreover, the imaging element 11 can enhance, with this interval and other matters that are appropriately set, the effect of preventing color mixing that occurs due to, for example, light diffracted or reflected in a portion lower than the inter-pixel light shielding portion 42 as described later. With this, the imaging element 11 can achieve high-resolution image taking without color mixing.

Figure 2:
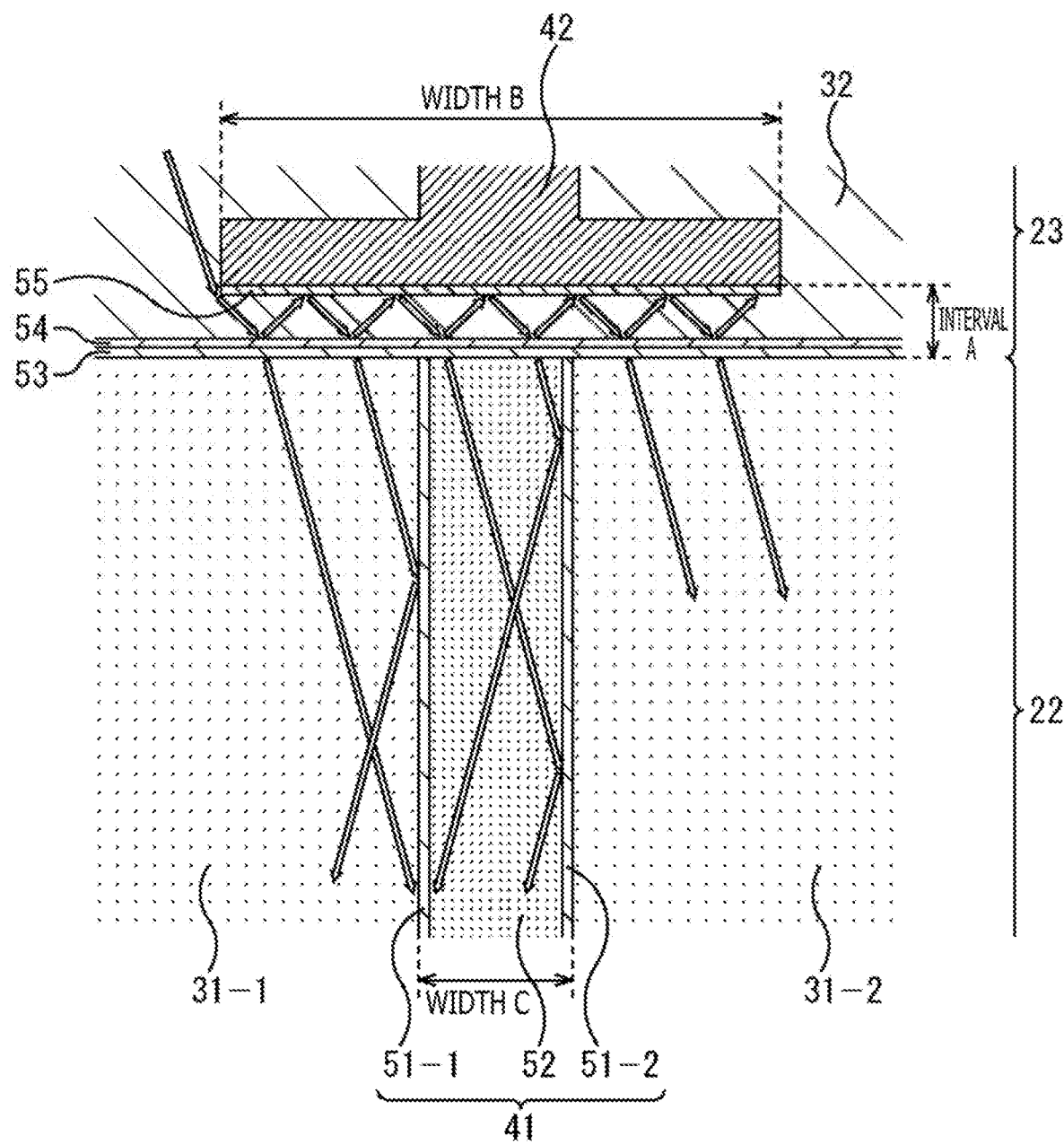
FIG. 2 is a diagram illustrating a structure between a light receiving surface of a semiconductor substrate and a tip end surface of an inter-pixel light shielding portion.

FIG. 2 illustrates a portion in the broken line circle of FIG. 1, that is, a structure between the light receiving surface of the semiconductor substrate 22 and the tip end surface of the inter-pixel light shielding portion 42 in an enlarged manner.

As illustrated in FIG. 2, the element isolation portion 41 is provided in the semiconductor substrate 22 to separate the photoelectric conversion portions 31-1 and 31-2 from each other, and has a structure in which a high-refractive index light absorbing portion 52 is sandwiched by low-refractive index insulating films 51-1 and 51-2.

For example, in a manufacturing process of the imaging element 11, from the front surface (surface facing downward of FIG. 1) side of the semiconductor substrate 22, a trench is formed for each pixel 12 to divide the semiconductor substrate 22, and an insulation material (for example, SiO2: silicon dioxide) that serves as the low-refractive index insulating film 51 is formed. With this, the low-refractive index insulating film 51-1 is formed on a side surface on the photoelectric conversion portion 31-1 side, while the low-refractive index insulating film 51-2 is formed on a side surface on the photoelectric conversion portion 31-2 side. Then, in the trench, a light absorbing material (for example, Poly-Si: polysilicon) that serves as the high-refractive index light absorbing portion 52 is embedded. Thus, the element isolation portion 41 is formed.

Note that examples of the material that is used as the high-refractive index light absorbing portion 52, that is, the light absorbing material, can include silicon, germanium, CIGS, InGaAs, and pigment (dye), other than polysilicon. Further, as the low-refractive index insulating films 51-1 and 51-2, a material having a refractive index largely different from those of both of the photoelectric conversion portion 31 and the high-refractive index light absorbing portion 52 is preferably used. Examples of the material of the low-refractive index insulating films 51-1 and 51-2 can include silicon nitride (SiN), hafnium oxide (HfO), and aluminum oxide (AlO), other than silicon dioxide.

Further, on the light receiving surface (surface facing upward of FIG. 2) of the semiconductor substrate 22, an insulating film 53 having an insulating property like the low-refractive index insulating film 51 is formed. On the insulating film 53, a highly dielectric insulating film (High-K film) 54 is formed with, for example, hafnium. In addition, on the tip end surface (surface facing downward of FIG. 2) of the inter-pixel light shielding portion 42, a barrier metal 55 is formed. The barrier metal 55 prevents the metal of the inter-pixel light shielding portion 42 from being diffused.

As illustrated in FIG. 2, in the imaging element 11, a space between the light receiving surface of the semiconductor substrate 22 and the tip end surface of the inter-pixel light shielding portion 42 is set to an interval A, and the transparent resin layer 32 is disposed in the space. Moreover, the interval A between the light receiving surface of the semiconductor substrate 22 and the tip end surface of the inter-pixel light shielding portion 42 is set to be sufficiently smaller than a width B of the tip end surface of the inter-pixel light shielding portion 42. Here, the tip end portion of the inter-pixel light shielding portion 42 is formed into an inverted T-shape in section as illustrated in FIG. 2 so as to have the width B sufficiently larger than the interval A in a direction in which the pixels 12 are adjacent to each other (horizontal direction in FIG. 2).

By setting the interval A between the light receiving surface of the semiconductor substrate 22 and the tip end surface of the inter-pixel light shielding portion 42 and the width B of the tip end surface of the inter-pixel light shielding portion 42 in this way, the imaging element 11 can enhance the effect of preventing color mixing that occurs due to, for example, light diffracted or reflected in the portion lower than the inter-pixel light shielding portion 42.

For example, as indicated by the hollow arrows of FIG. 2, light that has diagonally entered the pixel 12 is sometimes diffracted at an end portion of the tip end portion of the inter-pixel light shielding portion 42, thereby entering a gap between the light receiving surface of the semiconductor substrate 22 and the tip end surface of the inter-pixel light shielding portion 42. Moreover, it is assumed that the light is repeatedly reflected between the light receiving surface of the semiconductor substrate 22 and the tip end surface of the inter-pixel light shielding portion 42, thereby arriving at another adjacent pixel 12.

In view of this, in the imaging element 11, with the width B sufficiently smaller than the interval A, the number of reflections of light between the light receiving surface of the semiconductor substrate 22 and the tip end surface of the inter-pixel light shielding portion 42 can be increased, so that the light can be sufficiently attenuated. Thus, in the imaging element 11, light is prevented from passing through the space between the light receiving surface of the semiconductor substrate 22 and the tip end surface of the inter-pixel light shielding portion 42, thereby leaking into another adjacent pixel 12, with the result that color mixing that occurs due to, for example, diffracted light or reflected light can be prevented.

Further, in the imaging element 11, light that has entered the gap between the light receiving surface of the semiconductor substrate 22 and the tip end surface of the inter-pixel light shielding portion 42 partly enters the photoelectric conversion portion 31-1, and is reflected inward by the low-refractive index insulating film 51-1 to be subjected to photoelectric conversion.

In addition, the light that has entered the gap between the light receiving surface of the semiconductor substrate 22 and the tip end surface of the inter-pixel light shielding portion 42 partly enters the element isolation portion 41, and is repeatedly reflected by the low-refractive index insulating films 51-1 and 51-2 to be absorbed by the high-refractive index light absorbing portion 52. This means that, with the element isolation portion 41 provided to separate the pixels 12-1 and 12-2 from each other, light that has entered the gap between the light receiving surface of the semiconductor substrate 22 and the tip end surface of the inter-pixel light shielding portion 42 is prevented from leaking into the pixel 12-2. With this, the imaging element 11 can prevent the occurrence of color mixing.

Here, as illustrated in FIG. 2, in the imaging element 11, a width C of the element isolation portion 41 is set to be smaller than the width B of the tip end surface of the inter-pixel light shielding portion 42. By setting the width C of the element isolation portion 41 and the width B of the tip end surface of the inter-pixel light shielding portion 42 in this way, light is prevented from directly entering the element isolation portion 41, so that the light can be prevented from passing through the element isolation portion 41 to enter another adjacent pixel 12.

More specifically, in contrast to this, in a structure in which the width C of the element isolation portion 41 is larger than the width B of the tip end surface of the inter-pixel light shielding portion 42, there is a concern that light that directly enters the element isolation portion 41 may pass therethrough to enter another adjacent pixel 12, resulting in a reduction in effect of preventing the occurrence of color mixing.

Figure 3:
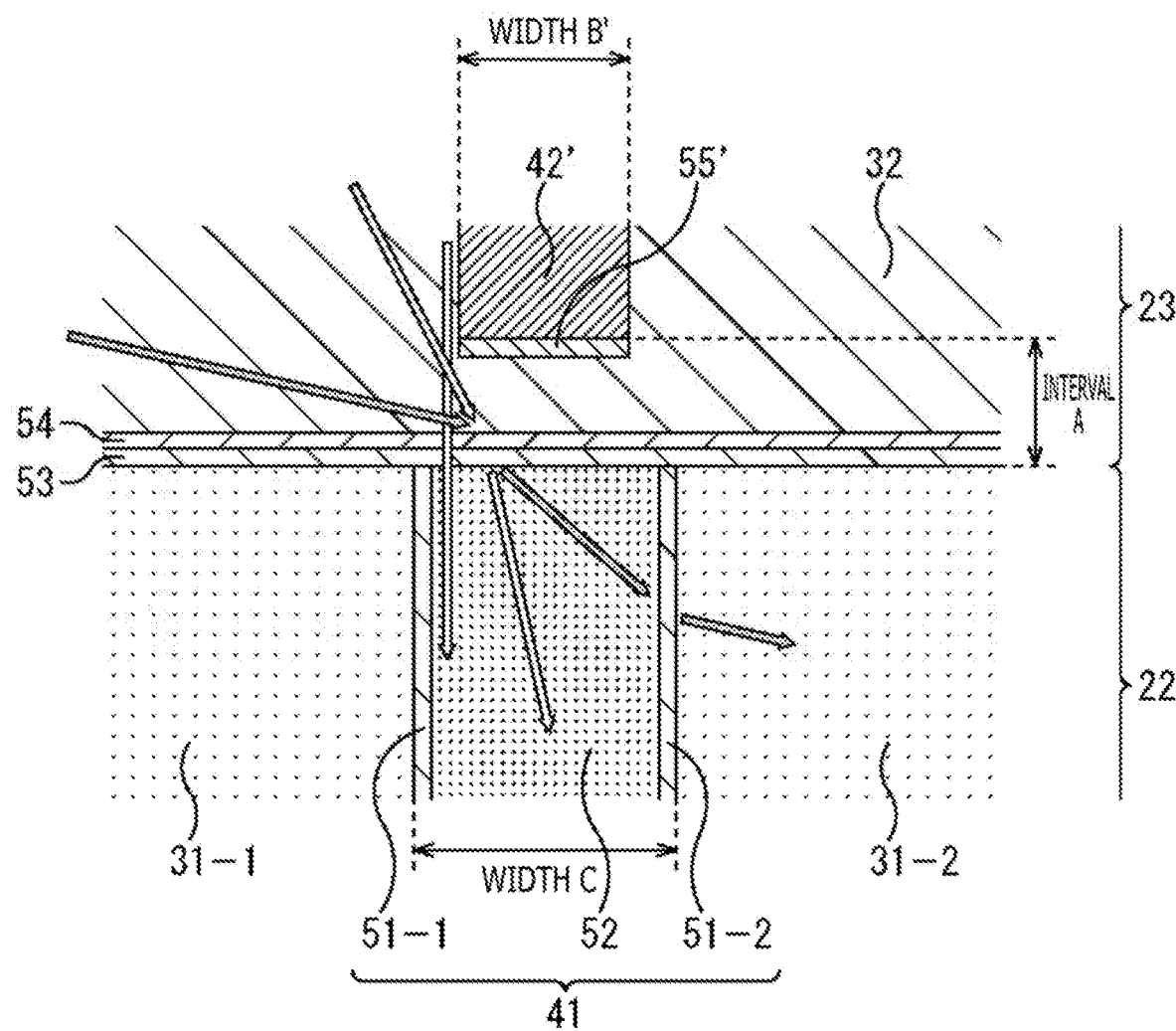
FIG. 3 is a diagram illustrating a structure in which a width of the tip end surface of the inter-pixel light shielding portion is small.

For example, as illustrated in FIG. 3, in a structure in which a width B' of the tip end portion of an inter-pixel light shielding portion 42' is smaller than the width C of the element isolation portion 41, light partly enters the element isolation portion 41 directly as indicated by the hollow arrow. In this case, an absolute amount of light that enters the element isolation portion 41 is increased and interfaces for the incident light are only two, with the result that light that has passed through the element isolation portion 41 enters the photoelectric conversion portion 31-2 with a high possibility. Further, in a configuration in which the width C of the element isolation portion 41 is increased, an effective area of the photoelectric conversion portion 31 is reduced. In view of this, the width C of the element isolation portion 41 is preferably as small as possible.

Thus, in order to prevent light from directly entering the element isolation portion 41, in the imaging element 11, as illustrated in FIG. 2, the width C of the element isolation portion 41 is smaller than the width B of the tip end surface of the inter-pixel light shielding portion 42. With this, the imaging element 11 can prevent the light that passes through the element isolation portion 41 to enter the photoelectric conversion portion 31-2, which is described with reference to FIG. 3, with the result that the imaging element 11 can effectively prevent the occurrence of color mixing, and can thus achieve higher-resolution image taking.

Figure 4:
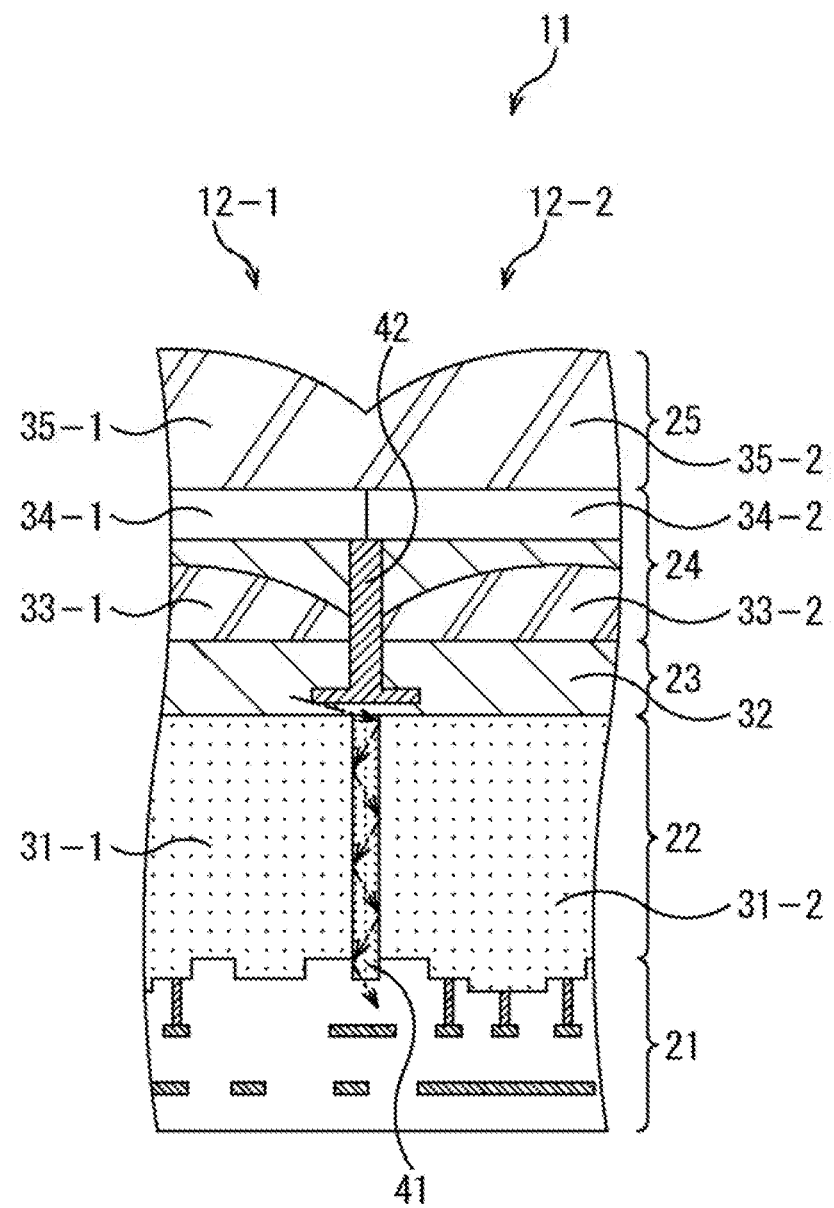
FIG. 4 is a diagram illustrating light that has entered an element isolation portion.

Further, as described above, the imaging element 11 is configured such that light that has entered the gap between the light receiving surface of the semiconductor substrate 22 and the tip end surface of the inter-pixel light shielding portion 42 enters the element isolation portion 41. Moreover, the light that has entered the element isolation portion 41 is repeatedly reflected inside the element isolation portion 41 to be attenuated as illustrated in FIG. 4, to thereby be prevented from leaking into another adjacent pixel 12.

Figure 5:
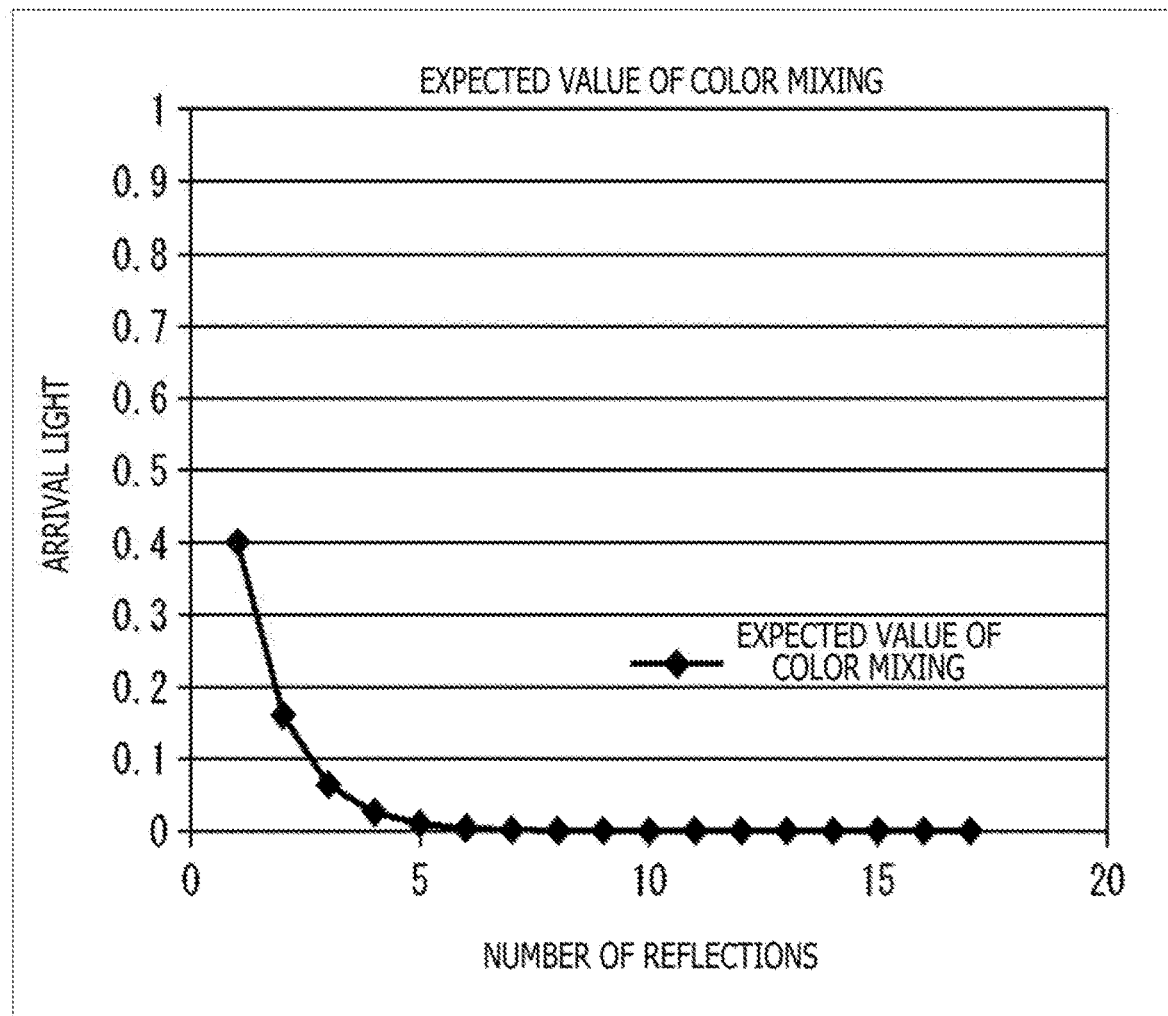
FIG. 5 is a diagram illustrating an expected value of color mixing.

Here, with reference to FIG. 5, there is described an expected value of color mixing that indicates a probability of color mixing that occurs due to light leaking into the adjacent pixel 12.

In FIG. 5, a vertical axis represents a ratio of arrival light with light that has entered the element isolation portion 41 being 1, the arrival light being light that arrives at the photoelectric conversion portion 31 of another adjacent pixel 12. This ratio of arrival light is the expected value of color mixing. Further, a horizontal axis represents the number of reflections that indicates how many times light is reflected inside the element isolation portion 41.

For example, the expected value of color mixing illustrated in FIG. 5 indicates a result of a simulation under conditions that a wavelength of incident light is 650 nm and photoelectric conversion is not performed in the element isolation portion 41. As illustrated in FIG. 5, it is found that, as the number of reflections is increased, the ratio of arrival light is reduced, leading to a reduction in probability of color mixing that occurs due to light that has entered the element isolation portion 41 to arrive at the photoelectric conversion portion 31 of another adjacent pixel 12.

In this way, the imaging element 11 preferably ensures an optical path length along which light that has entered the element isolation portion 41 is reflected by the number of times that makes the expected value of color mixing be substantially zero. Specifically, the imaging element 11 is configured such that the element isolation portion 41 is long enough to pass through the semiconductor substrate 22, with the result that the imaging element 11 can sufficiently attenuate light that has entered the element isolation portion 41, to thereby reduce the probability of the occurrence of color mixing due to the light.

Figure 6:
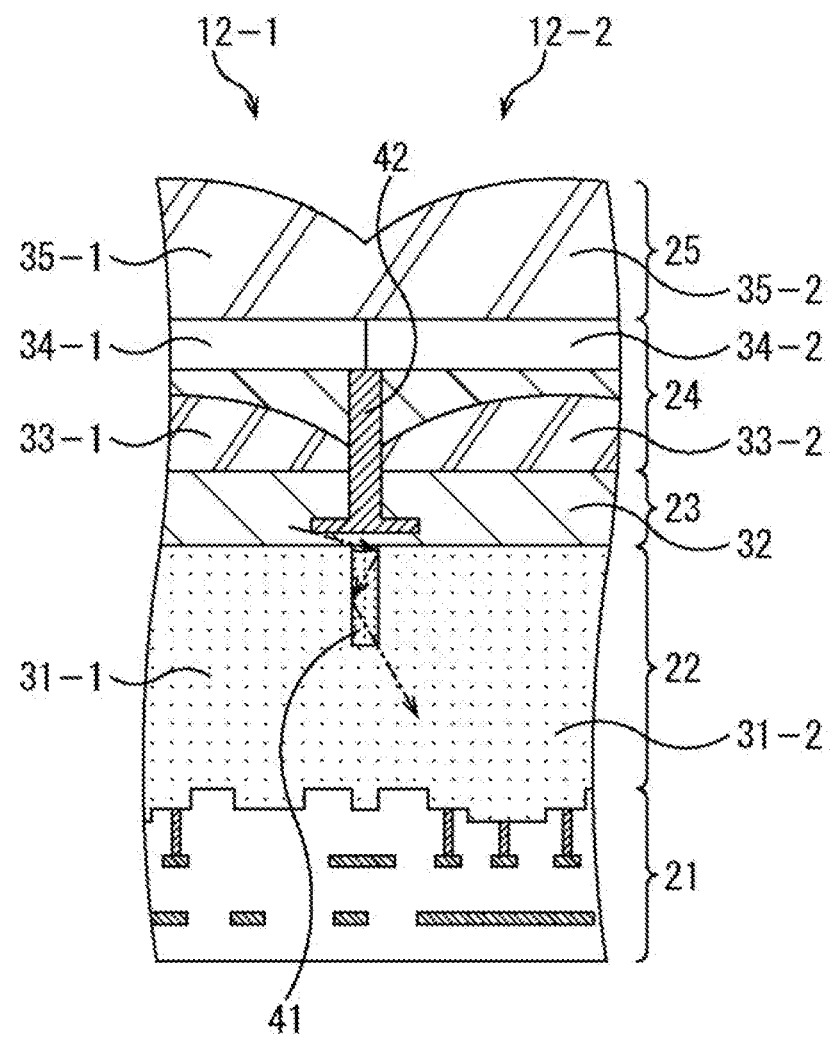
FIG. 6 is a diagram illustrating a configuration in which the element isolation portion does not pass through the semiconductor substrate.

In contrast, in the case of the structure in which the element isolation portion 41 does not pass through the semiconductor substrate 22 as illustrated in FIG. 6, for example, it is assumed that light that has entered the element isolation portion 41 enters another photoelectric conversion portion 31 without being sufficiently attenuated, with the result that color mixing occurs.

Figure 7:
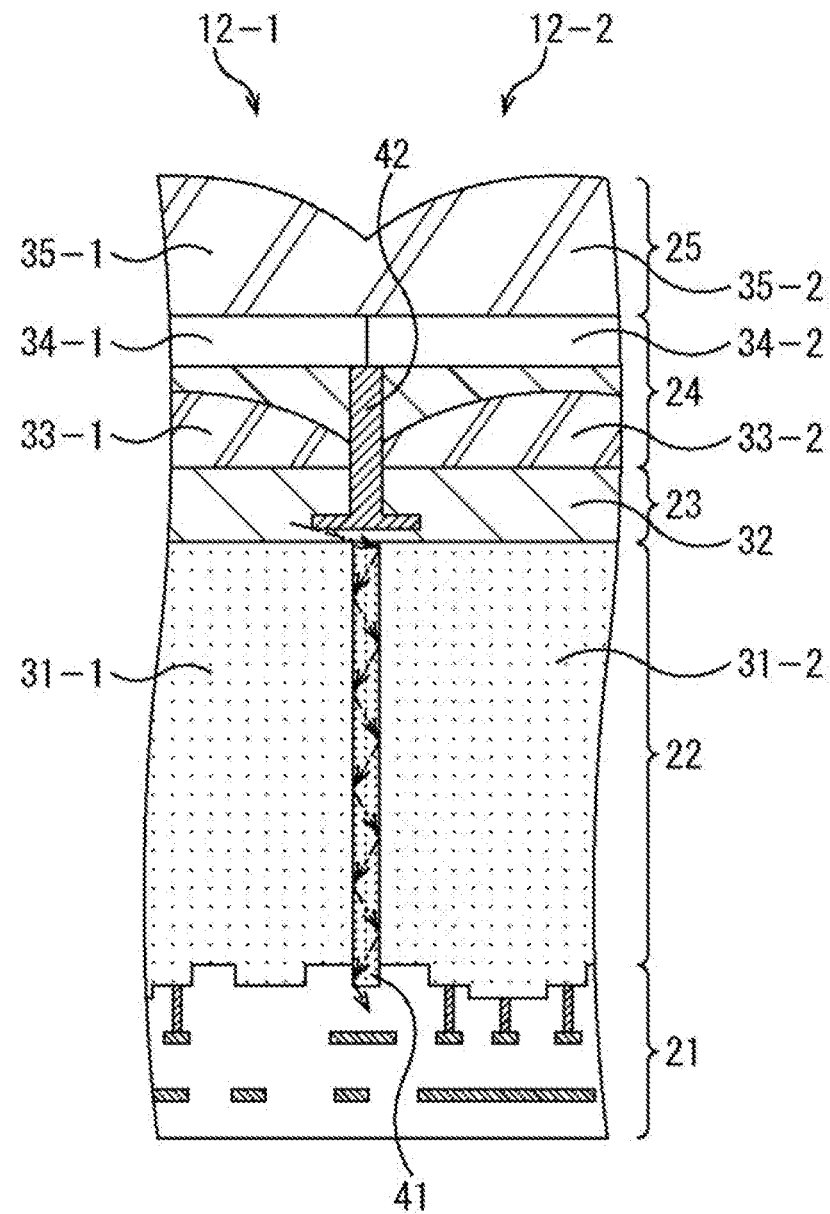
FIG. 7 is a diagram illustrating an effect of a configuration in which an optical path length in the element isolation portion is increased.

Further, in the case of the configuration in which the element isolation portion 41 passes through the semiconductor substrate 22, as a film thickness of the semiconductor substrate 22 is increased, the effect of preventing the occurrence of color mixing can be enhanced. Specifically, as illustrated in FIG. 7, with the element isolation portion 41 formed to pass through the semiconductor substrate 22 having a larger film thickness, the optical path length of light that has entered the element isolation portion 41 can be increased, and the light can be attenuated more. The semiconductor substrate 22 having a film thickness of, for example, 2.55 µm or more can ensure an optical path length enough that allows light that has entered the element isolation portion 41 to be sufficiently attenuated.

With this, the probability of color mixing that occurs due to light that has entered the element isolation portion 41 to enter another photoelectric conversion portion 31 again can be more reduced.

In this way, the imaging element 11 has the configuration in which the element isolation portion 41 passes through the semiconductor substrate 22 that has a larger film thickness, thereby being capable of reducing the probability of the occurrence of color mixing. The imaging element 11 can consequently achieve higher-resolution image taking.

Figure 8:
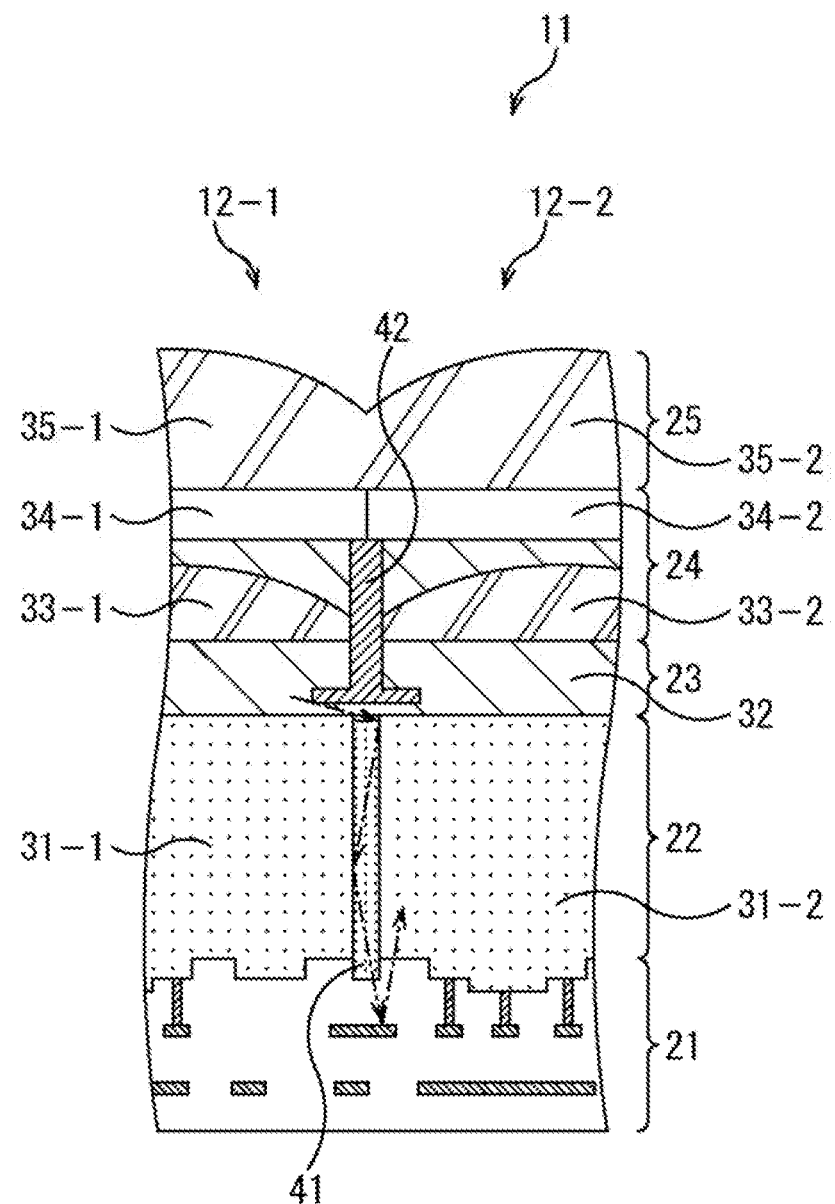
FIG. 8 is a diagram illustrating color mixing due to light that has passed through the element isolation portion.

Incidentally, it is assumed that, as illustrated in FIG. 8, even when the element isolation portion 41 is formed to pass through the semiconductor substrate 22, light that has passed through the element isolation portion 41 is reflected by the wiring to enter another adjacent pixel 12 as indicated by the long dashed short dashed line arrows of FIG. 8, with the result that color mixing occurs.

In a case where, with respect to a light amount of light that enters the element isolation portion 41, an optical path length along which the light passes through the element isolation portion 41 is short, for example, light that has not been able to be absorbed inside the element isolation portion 41 may arrive at an end surface on the wiring layer 21 side through the element isolation portion 41. In this case, the light that has leaked from the element isolation portion 41 into the wiring layer 21 is reflected by the wiring provided in the wiring layer 21 to enter another adjacent pixel 12, with the result that color mixing occurs.

Against color mixing that occurs in this way, measures described below with reference to FIG. 9 to FIG. 13 can be taken. Note that, in FIG. 9 to FIG. 13 referred to below, configurations common to those of the imaging element 11 illustrated in FIG. 1 described above are denoted by the same reference symbols, and the detailed description thereof is omitted.

<Second Configuration Example of Imaging Element>

Figure 9:
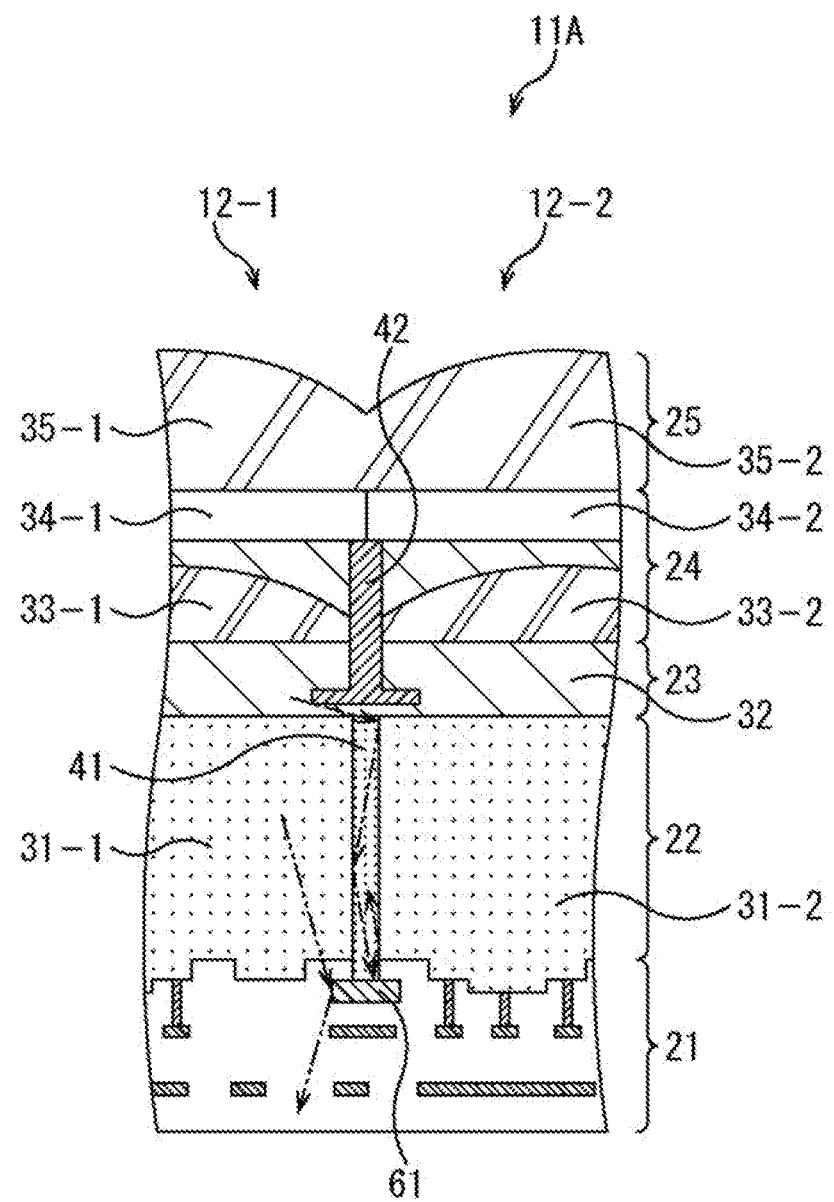
FIG. 9 is a diagram illustrating a configuration example of an imaging element according to a second embodiment.

FIG. 9 is a diagram illustrating a configuration example of an imaging element according to a second embodiment.

An imaging element 11A illustrated in FIG. 9 includes a reflecting member 61 that is disposed at a location that is on the tip end side of the element isolation portion 41 inside the wiring layer 21 and is closer to the element isolation portion 41 than other wiring lines. The reflecting member 61 can, for example, be disposed in contact with the tip end surface of the element isolation portion 41 that passes through the semiconductor substrate 22.

Thus, in the imaging element 11A, light that has not been absorbed by the element isolation portion 41 is reflected by the reflecting member 61 to be returned to the element isolation portion 41 as indicated by the long dashed short dashed line arrows of FIG. 9. With this, the imaging element 11A can avoid the occurrence of color mixing, which is described above with reference to FIG. 8.

In addition, the reflecting member 61 can reflect, toward the photoelectric conversion portion 31-1, light that has passed through the photoelectric conversion portion 31-1 to arrive at the wiring layer 21 as indicated by the long dashed double-short dashed line arrows of FIG. 9. With this, the imaging element 11A can prevent such light from entering the photoelectric conversion portion 31-2, with the result that the imaging element 11A can enhance the effect of preventing the occurrence of color mixing.

Figure 10:
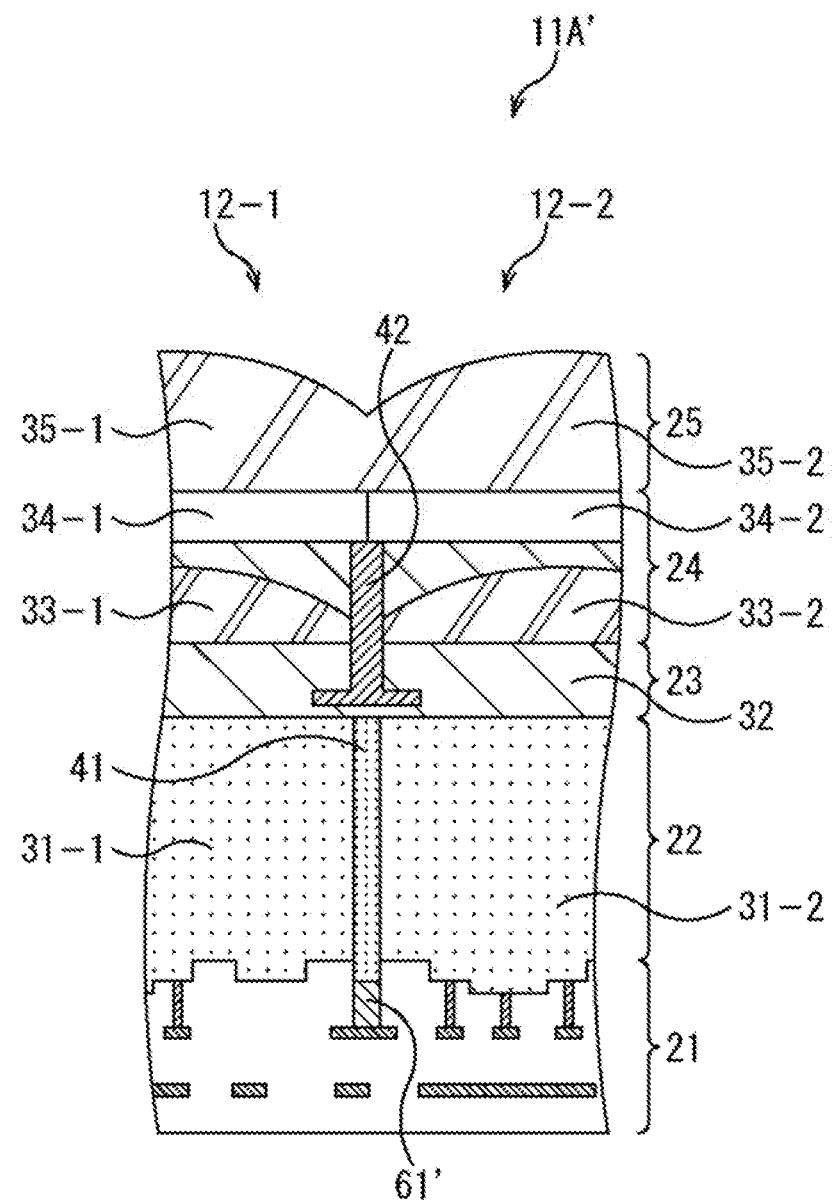
FIG. 10 is a diagram illustrating a modified example of the imaging element of FIG. 9.

Note that, as in an imaging element 11A' illustrated in FIG. 10, a reflecting member 61' is only required to be formed with at least substantially the same width as the element isolation portion 41, and is disposed in contact with the tip end surface of the element isolation portion 41 that passes through the semiconductor substrate 22. The reflecting member 61' can be formed as follows, for example. A trench is formed from the front surface (surface facing downward of FIG. 10) side of the semiconductor substrate 22, and the reflecting member 61' is formed immediately above the element isolation portion 41 provided inside the trench, so that the reflecting member 61' is at least partly in contact with the element isolation portion 41. Further, as illustrated in FIG. 10, the reflecting member 61' may be formed to be connected to the first-layer wiring formed in the wiring layer 21, and the first-layer wiring and the reflecting member 61' are formed into an inverted T-shape, for example. Note that this first-layer wiring may not be used as wiring but may only be used as a light-shielding film for blocking light.

The imaging element 11A' including the reflecting member 61' having such a shape can avoid the occurrence of color mixing, which is described above with reference to FIG. 8, and can prevent light from passing through a space between the element isolation portion 41 and the first-layer wiring to leak into another adjacent pixel 12.

<Third Configuration Example of Imaging Element>

Figure 11:
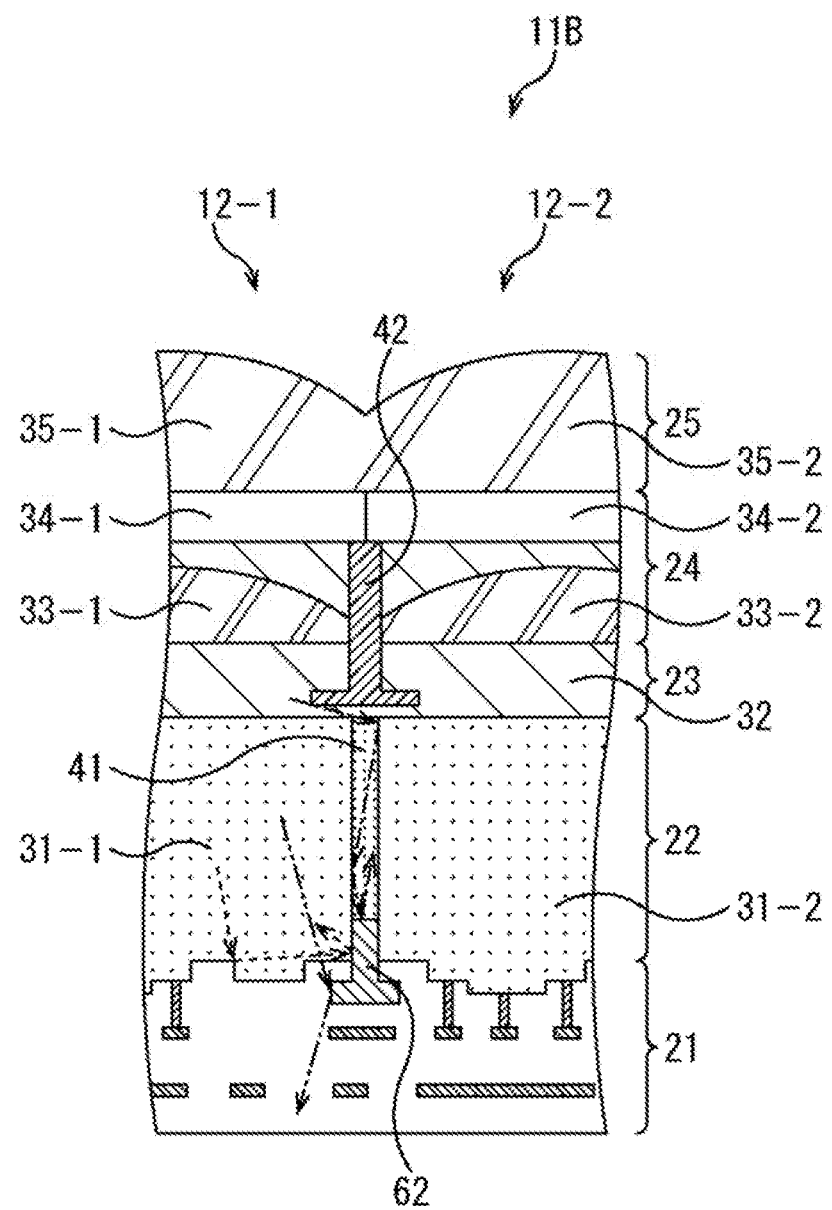
FIG. 11 is a diagram illustrating a configuration example of an imaging element according to a third embodiment.

FIG. 11 is a diagram illustrating a configuration example of an imaging element according to a third embodiment.

An imaging element 11B illustrated in FIG. 11 includes a reflecting member 62 that has a protruding shape and is disposed at a location that is on the tip end side of the element isolation portion 41 inside the wiring layer 21 and is closer to the element isolation portion 41 than other wiring lines. Moreover, the reflecting member 62 is formed into an inverted T-shape such that the central part thereof on the semiconductor substrate 22 side is partly embedded in a trench that is formed between the photoelectric conversion portions 31-1 and 31-2.

Thus, like the imaging element 11A of FIG. 9, the imaging element 11B can reflect light that has not been absorbed by the element isolation portion 41 to the element isolation portion 41, and can reflect light that has passed through the photoelectric conversion portion 31-1 toward the photoelectric conversion portion 31-1.

In addition, in the structure of the imaging element 11B, the reflecting member 62 is partly embedded in the trench, and the part is formed to be deeper than an STI (Shallow Trench Isolation) of the transistor of the pixel 12-1, thereby protruding upward in FIG. 11. Thus, in the imaging element 11B, light that is reflected by the STI of the transistor of the pixel 12-1 to travel to the photoelectric conversion portion 31-2 can be reflected by the reflecting member 62 as indicated by the broken line arrows of FIG. 11. With this, the imaging element 11B can prevent such light from entering the photoelectric conversion portion 31-2, with the result that the imaging element 11B can enhance the effect of preventing the occurrence of color mixing.

Figure 12:
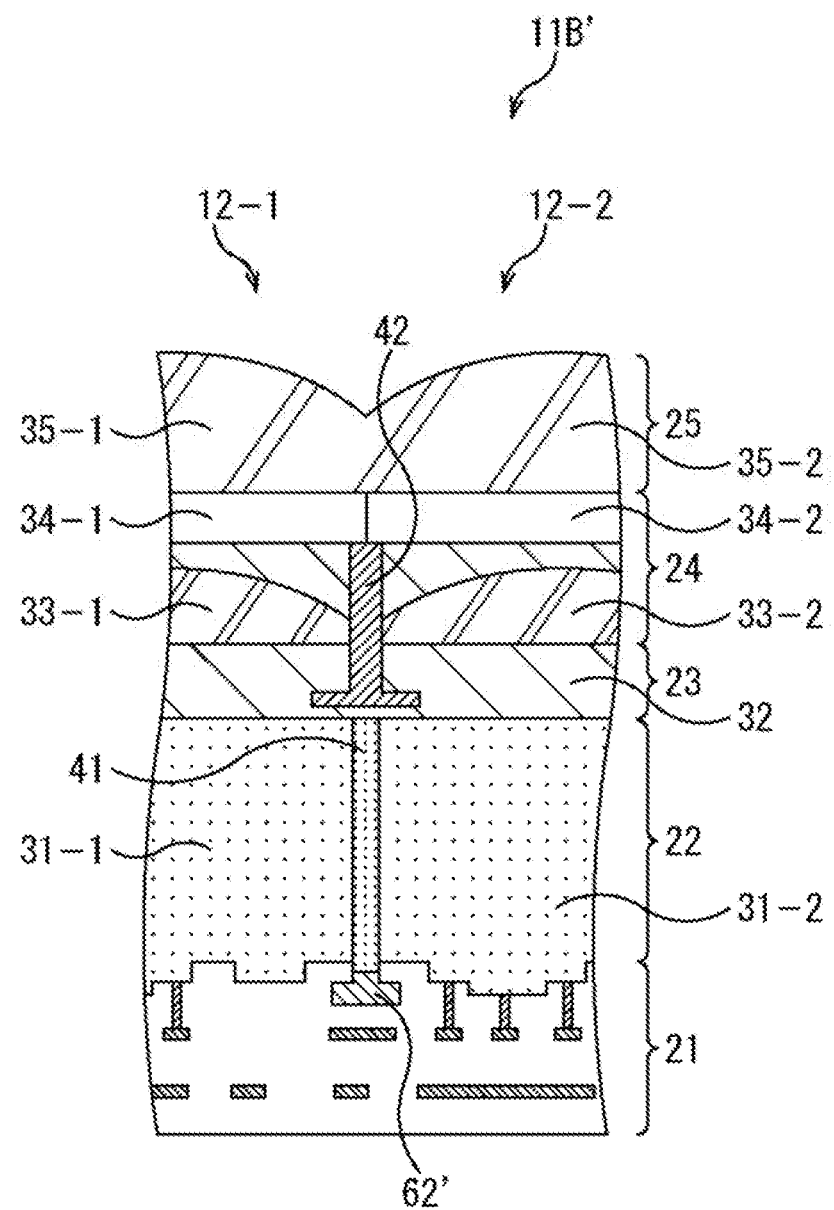
FIG. 12 is a diagram illustrating a modified example of the imaging element of FIG. 11.

Note that, as in an imaging element 11B' illustrated in FIG. 12, a part of a reflecting member 62' that is embedded in the trench formed in the semiconductor substrate 22 to form the element isolation portion 41 may be formed to be shorter than the part of the reflecting member 62 of FIG. 11. Specifically, the protruding part, which is embedded in the trench, of the reflecting member 62 of FIG. 11 is formed to be deeper than the STI and protrude upward as described above, but the protruding part, which is embedded in the trench, of the reflecting member 62' is formed to be shallower than the STI.

The imaging element 11B' including the reflecting member 62' having such a shape can reflect light that has not been absorbed by the element isolation portion 41 to the element isolation portion 41, thereby preventing the light from leaking toward the wiring layer 21. The imaging element 11B' can therefore prevent the occurrence of color mixing.

<Fourth Configuration Example of Imaging Element>

Figure 13:
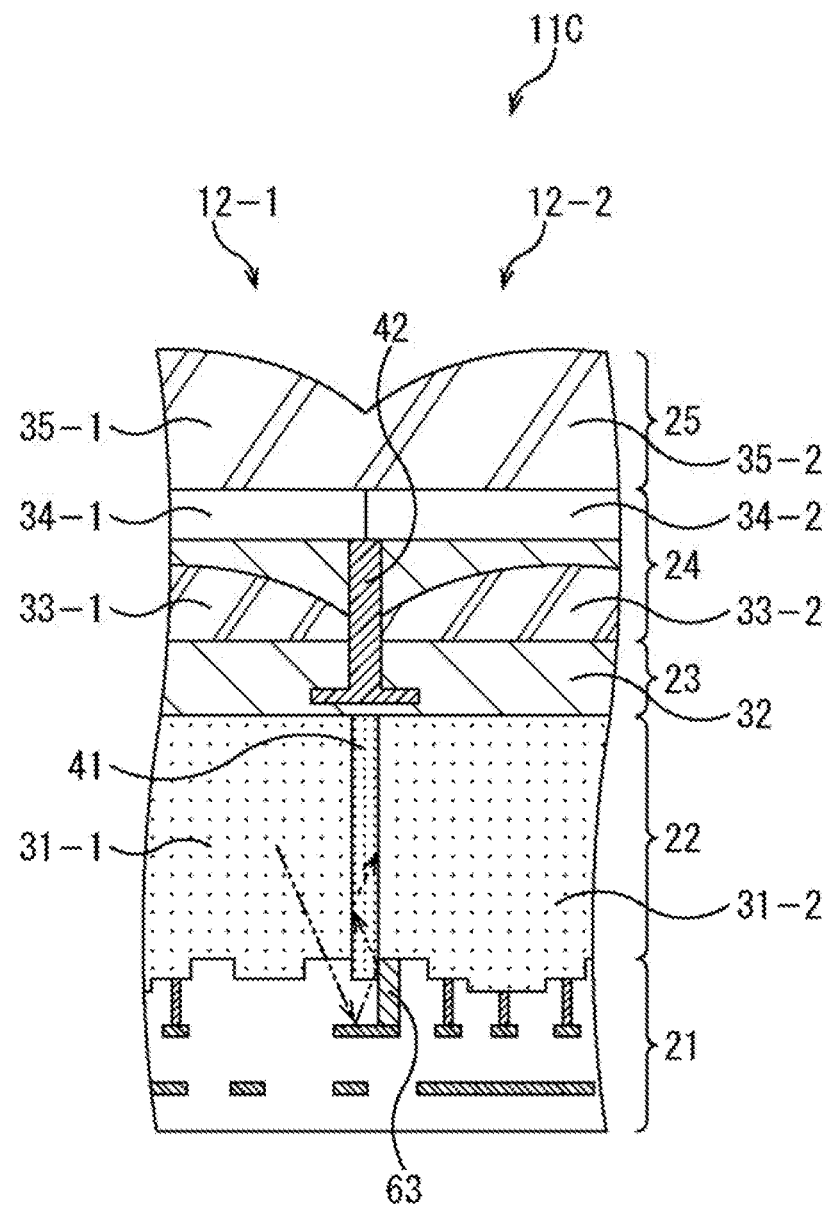
FIG. 13 is a diagram illustrating a configuration example of an imaging element according to a fourth embodiment.

FIG. 13 is a diagram illustrating a configuration example of an imaging element according to a fourth embodiment.

An imaging element 11C illustrated in FIG. 13 includes a reflecting member 63 that is disposed at a location that is on the side of the tip end of the element isolation portion 41 inside the wiring layer 21 and is closer to the element isolation portion 41 than other wiring lines. The reflecting member 63 can, for example, be disposed on the side of the tip end surface of the element isolation portion 41 that passes through the semiconductor substrate 22 such that the reflecting member 63 covers a space between the first-layer wiring and the semiconductor substrate 22.

Thus, in the imaging element 11C, as indicated by the long dashed double-short dashed line arrows of FIG. 13, light that has passed through the photoelectric conversion portion 31-1 to arrive at the wiring layer 21 is reflected by the reflecting member 63, to thereby be prevented from entering the photoelectric conversion portion 31-2 through the space between the first-layer wiring and the semiconductor substrate 22. As a matter of course, the reflecting member 63 also prevents light that has not been absorbed by the element isolation portion 41 from entering the photoelectric conversion portion 31-2. Moreover, the light reflected by the reflecting member 63 enters the element isolation portion 41 to be absorbed, for example. With this, the imaging element 11C can enhance the effect of preventing the occurrence of color mixing.

Note that it is assumed that, in a case where the wavelength range of light that the pixel 12-1 receives is longer than the wavelength range of light that the pixel 12-2 receives, the light that the pixel 12-1 receives is more likely to pass through the photoelectric conversion portion 31-1. Thus, in this case, the imaging element 11C preferably includes the reflecting member 63 on the side of the element isolation portion 41 on the pixel 12-2 side as illustrated in FIG. 13.

<Modified Example of Imaging Element>

Figure 14:
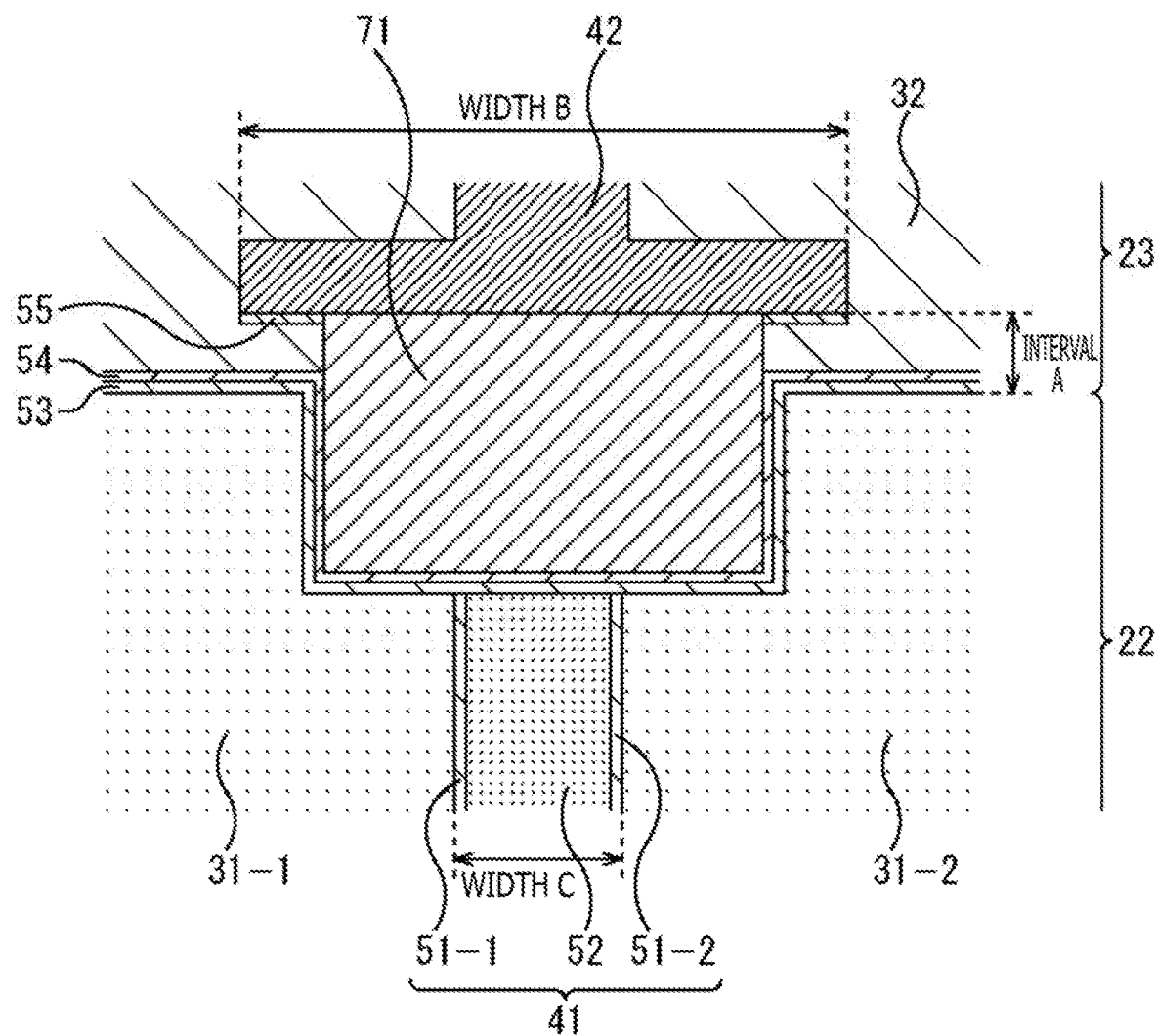
FIG. 14 is a diagram illustrating a modified example of the structure between the semiconductor substrate and the inter-pixel light shielding portion.

FIG. 14 is a diagram illustrating a modified example of the structure between the semiconductor substrate 22 and the inter-pixel light shielding portion 42.

As described above, the imaging element 11 has the structure that can sufficiently prevent the occurrence of color mixing, but in a case where incident light is too strong and even such a structure cannot prevent the light from being mixed, it is concerned that color mixing occurs. For example, it is assumed that, in the pixel 12 including the color filter 34 of, for example, white (transparent) or cyan, a small amount of light is absorbed by the color filter 34 and more strong light thus enters the pixel 12.

In view of this, in the imaging element 11, in order to enhance the effect of preventing the occurrence of color mixing, an embedded light-shielding film 71 can be formed on the light receiving surface side of the element isolation portion 41.

Specifically, as illustrated in FIG. 14, the imaging element 11 has a structure in which the embedded light-shielding film 71 having a width that is larger than the width C of the element isolation portion 41 and is smaller than the width B of the tip end portion of the inter-pixel light shielding portion 42 is embedded on the light receiving surface side of the element isolation portion 41. For example, the back surface of the semiconductor substrate 22 is grooved in accordance with the shape of the embedded light-shielding film 71, and after the insulating film 53 and the highly dielectric insulating film 54 are formed on the back surface of the semiconductor substrate 22, a material having a light-shielding property is embedded in the grooved portion. The embedded light-shielding film 71 is formed in this way.

From the viewpoint of characteristics in dark, in general, a light-shielding film is desirably formed only in the trench formed in the semiconductor substrate 22 to form the element isolation portion 41. However, in a case where a silicon wafer warps in the manufacturing process of the imaging element 11 and the semiconductor substrate 22 thus warps, it is difficult to uniformly process the entire silicon wafer. In particular, the trench that is formed in the semiconductor substrate 22 to provide the element isolation portion 41 is preferably formed to be narrow in width, and hence, it is assumed that the grooving for forming the embedded light-shielding film 71 in the trench is quite difficult processing.

In view of this, in the imaging element 11, as illustrated in FIG. 14, the embedded light-shielding film 71 is preferably formed to have a width slightly larger than the width of the trench that is formed in the semiconductor substrate 22 to provide the element isolation portion 41. With this, with a manufacturing margin of the imaging element 11 being increased, the effect of preventing the occurrence of color mixing can be enhanced.

<Fifth and Sixth Configuration Examples of Imaging Element>

Figure 15:
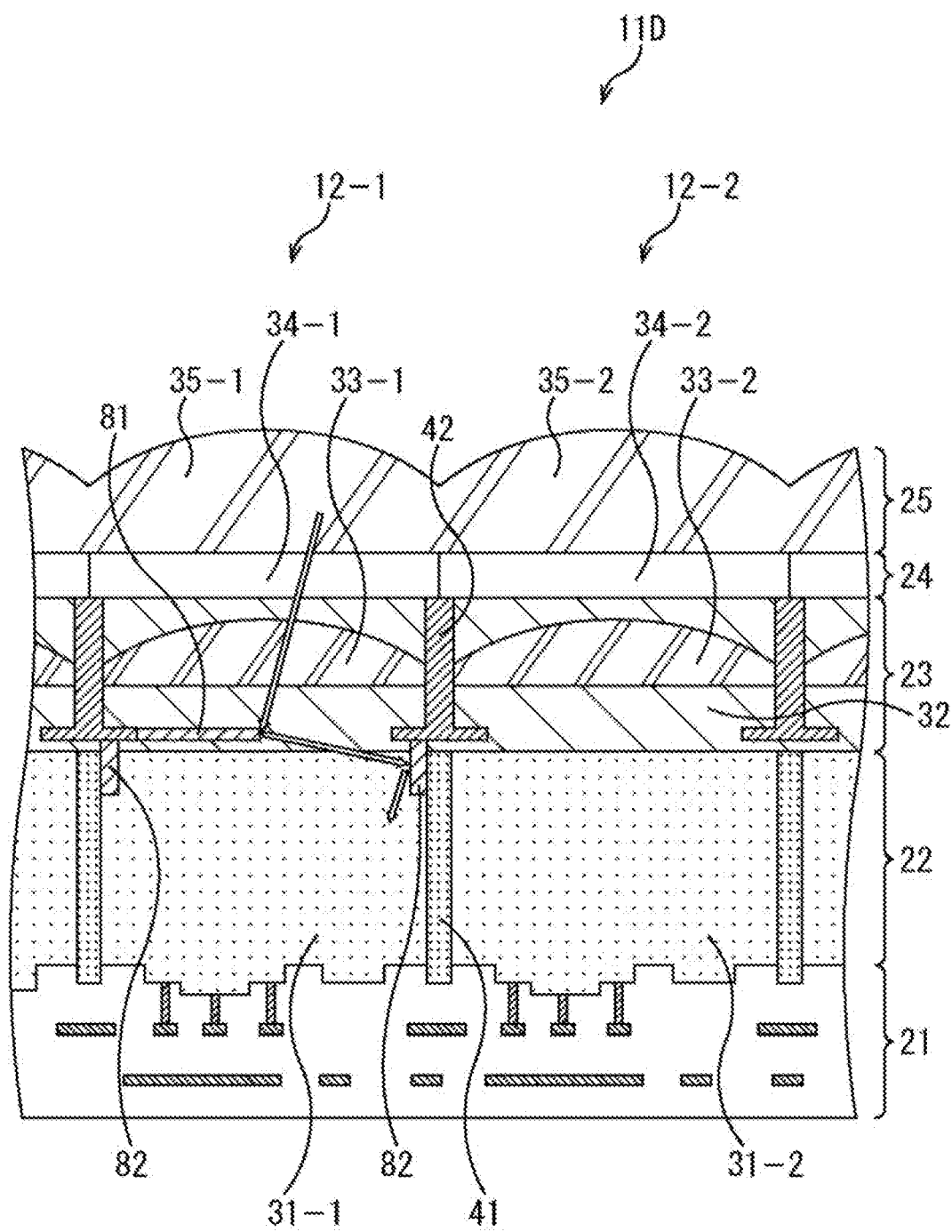
FIG. 15 is a diagram illustrating a configuration example of an imaging element according to a fifth embodiment.
Figure 16:
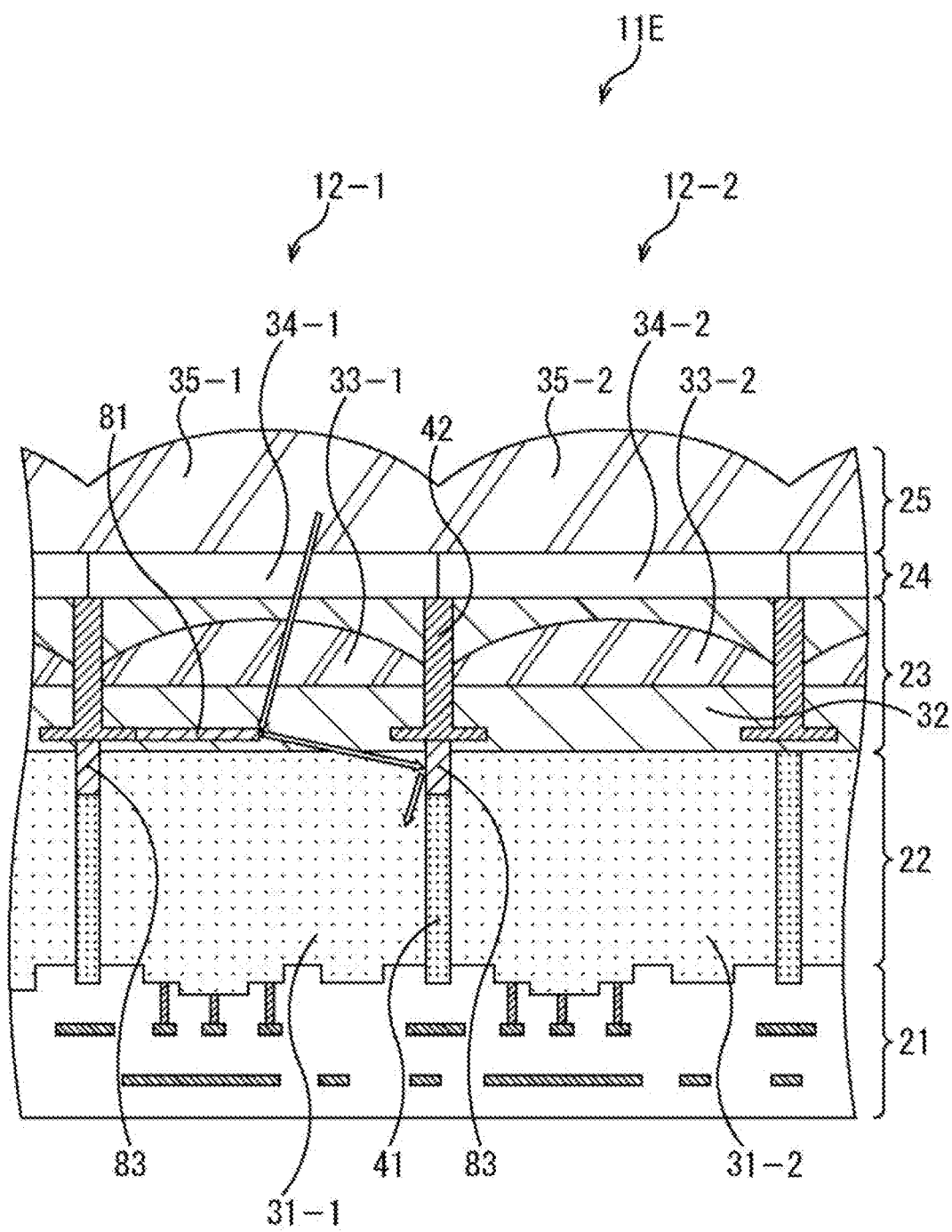
FIG. 16 is a diagram illustrating a configuration example of an imaging element according to a sixth embodiment.

FIG. 15 and FIG. 16 are diagrams illustrating configuration examples of imaging elements according to fifth and sixth embodiments.

In a case where, for example, the pixel 12-1 is a special pixel such as an image plane phase difference pixel for detecting phase difference on the image plane of the imaging element 11, it is concerned that color mixing locally gets worse.

Specifically, in a case where the pixel 12-1 is an image plane phase difference pixel as illustrated in FIG. 15 and FIG. 16, the pixel 12-1 has a phase difference light-shielding film 81 formed in the planarization film 23 thereof. The phase difference light-shielding film 81 shields substantially half of the photoelectric conversion portion 31-1 from light to detect phase difference. Here, in the description of FIG. 15 and FIG. 16, the pixel 12-1 in which the phase difference light-shielding film 81 is formed is also referred to as an "image plane phase difference pixel 12-1," and the pixel 12-2 in which the phase difference light-shielding film 81 is not formed is also referred to as a "normal pixel 12-2."

Moreover, when light that has entered the image plane phase difference pixel 12-1 is reflected by the side surface of the phase difference light-shielding film 81, the reflected light sometimes travels to the normal pixel 12-2 as indicated by the hollow arrows of FIG. 15 and FIG. 16. It is difficult to positively block such reflected light only by the element isolation portion 41 provided between the image plane phase difference pixel 12-1 and the normal pixel 12-2, and the reflected light that has entered the photoelectric conversion portion 31-2 of the normal pixel 12-2 makes color mixing worse.

In view of this, an imaging element 11D illustrated in FIG. 15 includes an embedded light-shielding film 82. For example, the embedded light-shielding film 82 is formed by grooving the light receiving surface of the semiconductor substrate 22, so as to surround the periphery of the photoelectric conversion portion 31-1 of the image plane phase difference pixel 12-1, and embedding a metal material having a light-shielding property in the groove.

Here, there is a concern that a configuration in which the groove is formed in the light receiving surface of the semiconductor substrate 22 and the light-shielding metal is embedded therein may supply dark electrons due to, for example, the occurrence of damage or metal contamination, thereby deteriorating the characteristics of the normal pixel 12-2 in dark.

In contrast to this, in the structure of the imaging element 11D, the embedded light-shielding film 82 is provided only on the image plane phase difference pixel 12-1 side of the element isolation portion 41. With this, even when the groove is formed in the light receiving surface to provide the embedded light-shielding film 82, dark electrons generated in the groove are prevented from leaking into the normal pixel 12-2. Thus, the imaging element 11D can prevent color mixing that occurs due to light reflected by the side surface of the phase difference light-shielding film 81, while avoiding the deterioration in characteristics in dark due to dark electrons.

Note that, for example, the imaging element 11D may employ a structure in which the phase difference light-shielding film 81 and the embedded light-shielding film 82 are formed in an integrated manner.

Further, an imaging element 11E illustrated in FIG. 16 includes an embedded light-shielding film 83. The embedded light-shielding film 83 is formed by embedding, from the light receiving surface side of the semiconductor substrate 22, a metal material having a light-shielding property to a predetermined depth in the trench that is formed in the semiconductor substrate 22 to provide the element isolation portion 41.

The imaging element 11E configured as described above can prevent, by the embedded light-shielding film 83, color mixing that occurs due to light reflected by the side surface of the phase difference light-shielding film 81, like the imaging element 11D of FIG. 15. In addition, the imaging element 11E does not require the grooving in the light receiving surface of the semiconductor substrate 22 unlike the imaging element 11D of FIG. 15, and can thus avoid the risk of deterioration in characteristics in dark.

<Configuration Example of Imaging Device>

Note that the imaging element 11 as described above is applicable to, for example, various electronic apparatus including imaging systems such as digital still cameras and digital video cameras, mobile phones having an imaging function, and other apparatus having the imaging function.

Figure 17:
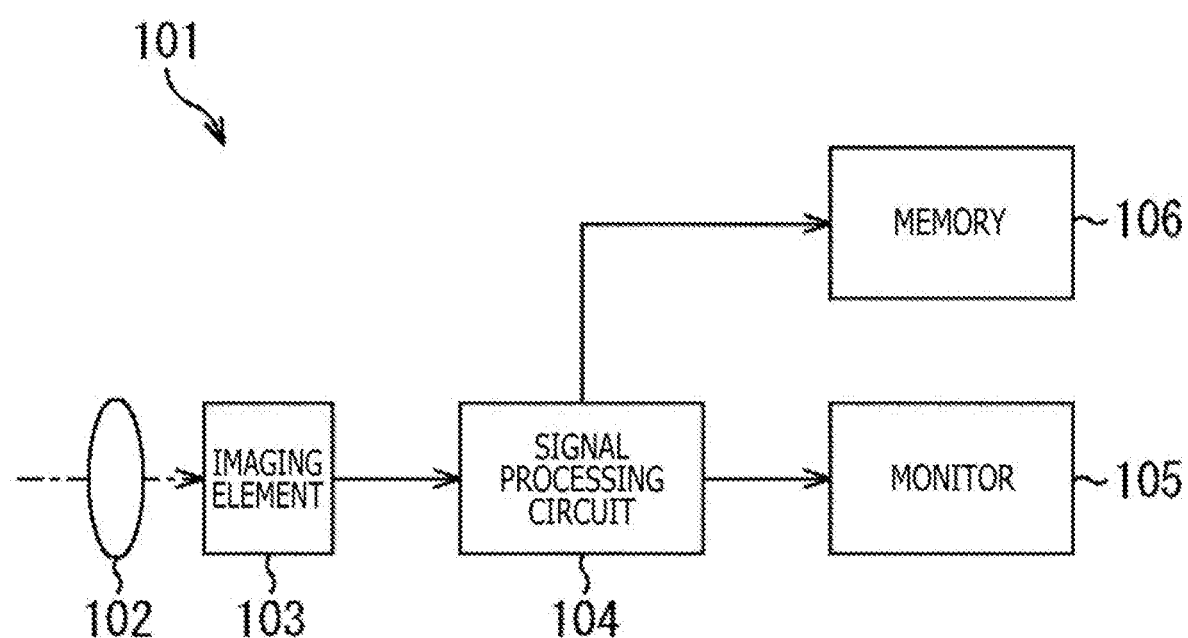
FIG. 17 is a block diagram illustrating a configuration example of an imaging device.

FIG. 17 is a block diagram illustrating a configuration example of an imaging device that is mounted on an electronic apparatus.

As illustrated in FIG. 17, an imaging device 101 includes an optical system 102, an imaging element 103, a signal processing circuit 104, a monitor 105, and a memory 106, and can take still images and moving images.

The optical system 102 includes one or a plurality of lenses and guides image light (incident light) from an object to the imaging element 103, to thereby form an image on the light receiving surface (sensor portion) of the imaging element 103.

To the imaging element 103, the above-mentioned imaging element 11 is applied. The imaging element 103 stores electrons for a certain period depending on the image that is formed on the light receiving surface through the optical system 102. Moreover, a signal depending on the electrons stored in the imaging element 103 is supplied to the signal processing circuit 104.

The signal processing circuit 104 performs various signal processing processes on the pixel signal output from the imaging element 103. The image (image data) obtained through the signal processing by the signal processing circuit 104 is supplied to the monitor 105 to be displayed or is supplied to the memory 106 to be stored (recorded).

When the above-mentioned imaging element 11 is applied to the imaging device 101 configured in this way, the imaging device 101 can take higher-resolution images, for example.

<Usage Example of Image Sensor>

Figure 18:
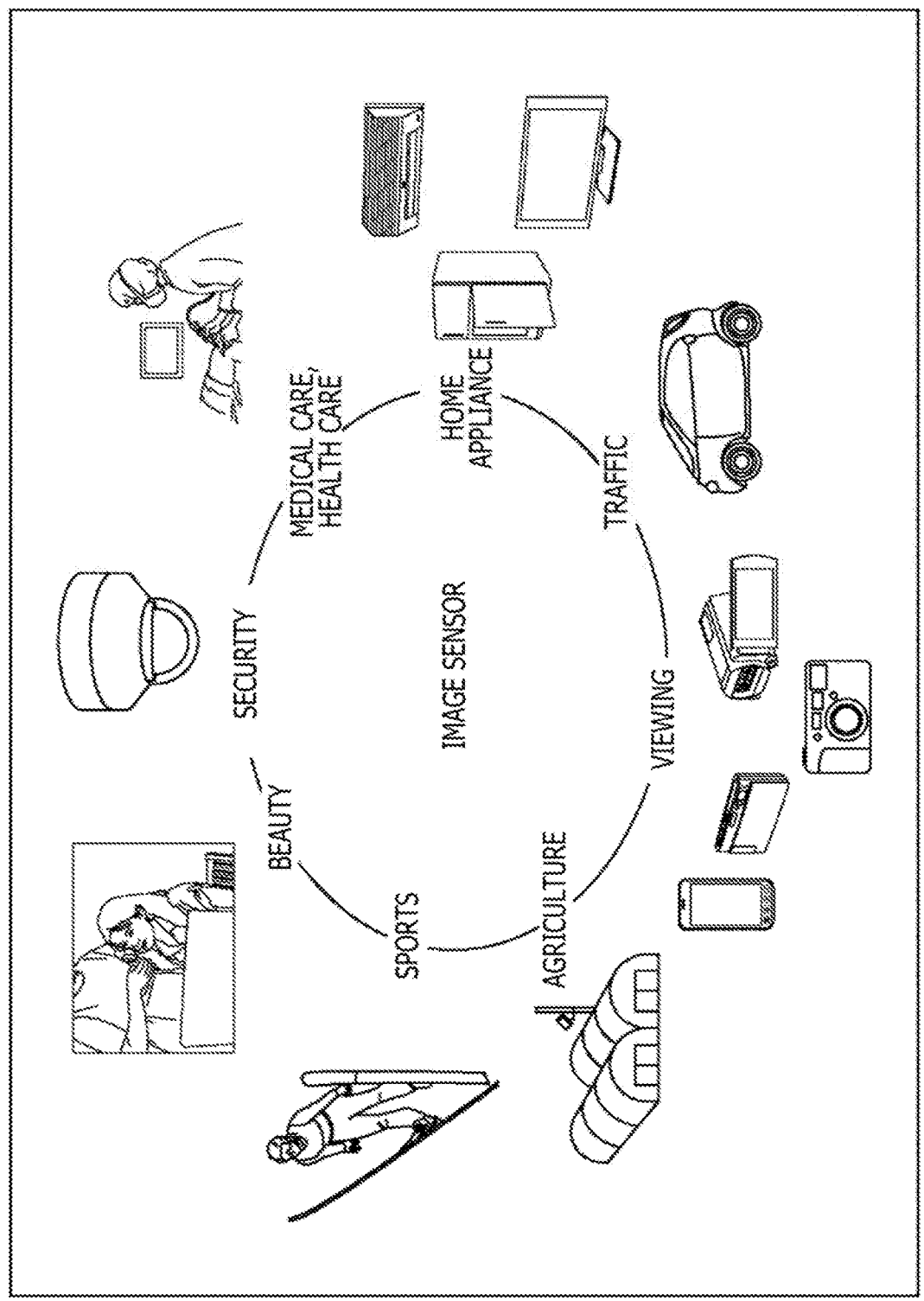
FIG. 18 is a diagram illustrating usage examples in which an image sensor is used.

FIG. 18 is a diagram illustrating usage examples in which the above-mentioned image sensor is used.

The above-mentioned image sensor can be used in various cases in which light such as visible light, infrared light, ultraviolet light, or X-rays is sensed, for example, as described below.

- Devices for taking images for viewing, such as digital cameras and mobile devices with a camera function
- Devices for use in traffic, such as in-vehicle sensors configured to take images of, for example, the front and rear views, around view, and inside view of a vehicle, monitoring cameras configured to monitor running vehicles and roads, and range-finding sensors configured to measure, for example, a distance between vehicles, for the purpose of safe driving including automatic stop and driver's condition recognition, for example
- Devices that are provided to TVs, refrigerators, air conditioners, and other types of home appliances, to thereby take an image of a gesture made by a user and allow such apparatus to operate on the basis of the gesture
- Devices for use in medical care and healthcare, such as endoscopes and devices for imaging blood vessels by receiving infrared ray
- Devices for use in security, such as monitoring cameras for crime prevention and cameras for person authentication
- Devices for use in beauty, such as skin measuring instruments configured to take skin images and microscopes configured to take scalp images
- Devices for use in sports, such as action cameras and wearable cameras for sport use
- Devices for use in agriculture, such as cameras for monitoring the conditions of fields or crops <Application Example to Moving Body>

The technology according to the present disclosure (present technology) is applicable to various products. For example, the technology according to the present disclosure may be realized as a device that is mounted on any kind of moving bodies including vehicles, electric vehicles, hybrid electric vehicles, motorcycles, bicycles, personal mobilities, airplanes, drones, vessels, and robots.

Figure 19:
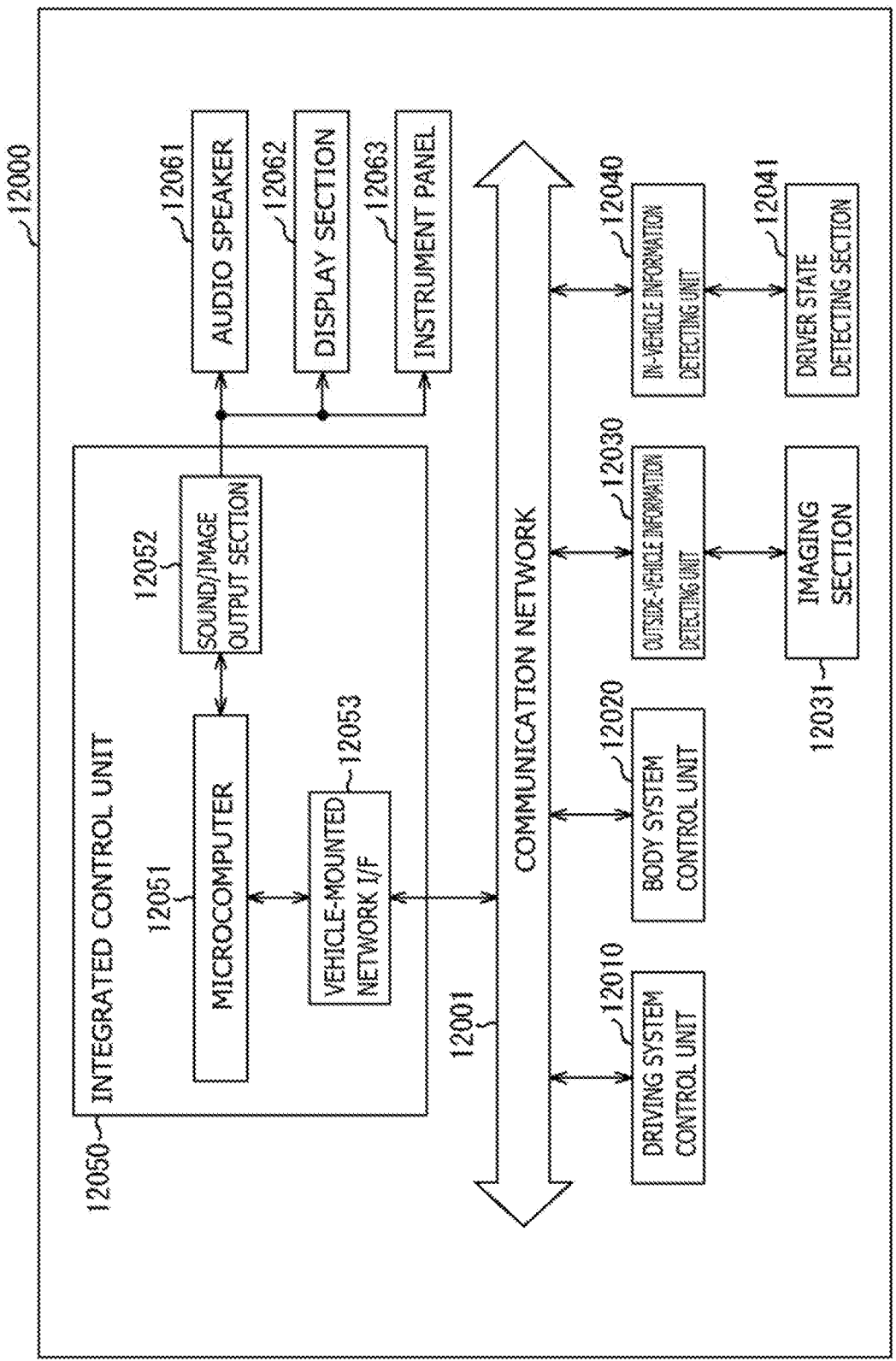
FIG. 19 is a block diagram depicting an example of schematic configuration of a vehicle control system.

FIG. 19 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 19, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 19, an audio speaker 12061, a display section 12062, and an instrument panel 12063 are illustrated as the output device. The display section 12062 may, for example, include at least one of an on-board display and a head-up display.

Figure 20:
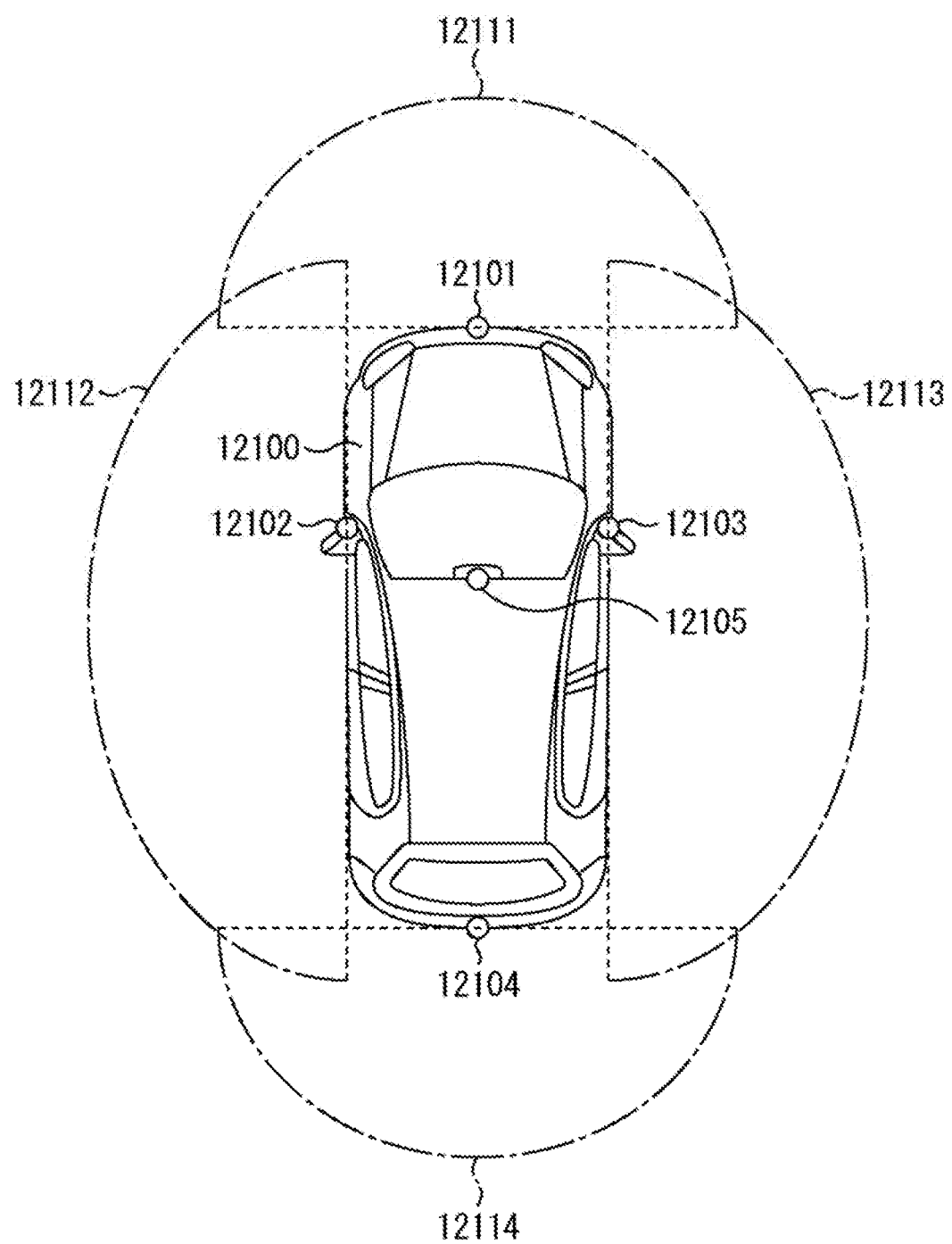
FIG. 20 is a diagram of assistance in explaining an example of installation positions of an outside-vehicle information detecting section and an imaging section.

FIG. 20 is a diagram depicting an example of the installation position of the imaging section 12031.

In FIG. 20, the imaging section 12031 includes imaging sections 12101, 12102, 12103, 12104, and 12105.

The imagingسections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 20 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described so far. The technology according to the present disclosure is applicable to the imaging section 12031 of the configuration described above, for example. Specifically, for example, the imaging element 11 of FIG. 1 is applicable to the imaging section 12031. The imaging section 12031 to which the technology according to the present disclosure is applied can acquire outside-vehicle information as higher-resolution images, for example, to thereby achieve improvement in safety of automated driving, example.

<Example of Configuration Combination>

Note that the present technology can also take the following configurations.

(1)

An imaging element including:
a photoelectric conversion portion that is provided in a semiconductor substrate for each of pixels and performs photoelectric conversion on light that enters through a filter layer allowing light in a predetermined wavelength range to pass therethrough;
an element isolation portion configured to separate the photoelectric conversion portions of the pixels adjacent to each other in the semiconductor substrate; and
an inter-pixel light shielding portion that is disposed between the pixels in a layer that is provided between the semiconductor substrate and the filter layer so as to be separated from a light receiving surface of the semiconductor substrate by a predetermined interval,
in which an interval between the light receiving surface of the semiconductor substrate and a tip end surface of the inter-pixel light shielding portion is smaller than a width of the tip end surface of the inter-pixel light shielding portion.

(2)

The imaging element according to Item (1),
in which the element isolation portion has a width smaller than a width of the tip end surface of the inter-pixel light shielding portion.

(3)

The imaging element according to Item (1) or (2),
in which the element isolation portion is provided to pass through the semiconductor substrate.

(4)

The imaging element according to any one of Items (1) to (3), further including:
a reflecting member that reflects light and is disposed at a location that is on a tip end side of the element isolation portion in a wiring layer and is closer to the element isolation portion than wiring formed in the wiring layer, the wiring layer being stacked on a surface of the semiconductor substrate that is opposite to the light receiving surface.

(5)

The imaging element according to Item (4),
in which the reflecting member is disposed in contact with the element isolation portion in a trench that is formed in the semiconductor substrate.

(6)

The imaging element according to Item (4),
in which the reflecting member has a shape having a part embedded in a trench formed in the semiconductor substrate to form the element isolation portion.

(7)

The imaging element according to Item (6),
in which the part of the reflecting member that is embedded in the trench is formed to be deeper than an STI (Shallow Trench Isolation) of a transistor of the pixel.

(8)

The imaging element according to any one of Items (1) to (3), further including:
a reflecting member that reflects light and is disposed at a location that is on a side of a tip end of the element isolation portion in a wiring layer and is closer to the element isolation portion than wiring formed in the wiring layer, the wiring layer being stacked on a surface of the semiconductor substrate that is opposite to the light receiving surface.

(9)

The imaging element according to any one of Items (1) to (8),
in which the pixel includes an image plane phase difference pixel including a phase difference light-shielding film for detecting phase difference on an image plane of the imaging element, and
the imaging element is provided with an embedded light-shielding film embedded from the light receiving surface so as to surround the photoelectric conversion portion of the image plane phase difference pixel.

(10)

An electronic apparatus, including:
an imaging element including
a photoelectric conversion portion that is provided in a semiconductor substrate for each of pixels and performs photoelectric conversion on light that enters through a filter layer allowing light in a predetermined wavelength range to pass therethrough,
an element isolation portion configured to separate the photoelectric conversion portions of the pixels adjacent to each other in the semiconductor substrate, and
an inter-pixel light shielding portion that is disposed between the pixels in a layer that is provided between the semiconductor substrate and the filter layer so as to be separated from a light receiving surface of the semiconductor substrate by a predetermined interval,
in which an interval between the light receiving surface of the semiconductor substrate and a tip end surface of the inter-pixel light shielding portion is smaller than a width of the tip end surface of the inter-pixel light shielding portion.

Note that the present embodiment is not limited to the embodiments described above, and various modifications can be made thereto without departing from the gist of the present disclosure.

REFERENCE SIGNS LIST

11 Imaging element, 12 Pixel, 21 Wiring layer, 22 Semiconductor substrate, 23 Planarization film, 24 filter layer, 25 On-chip lens layer, 31 Photoelectric conversion portion, 32 Resin layer, 33 inner lens, 34 Color filter, 35 Microlens, 41 Element isolation portion, 42 Inter-pixel light shielding portion, 51 Low-refractive index insulating film, 52 High-refractive index light absorbing portion, 53 Insulating film, 54 Highly dielectric insulating film, 55 Barrier metal, 61 to 63 Reflecting member, 71 Embedded light-shielding film, 81 Phase difference light-shielding film, 82, 83 Embedded light-shielding film

What is claimed is:

1. A light detecting device, comprising:
a first photoelectric conversion portion and a second photoelectric conversion portion disposed in a semiconductor substrate in a cross-sectional view;
a separation region disposed between the first photoelectric conversion portion and the second photoelectric conversion portion in the cross-sectional view;
a first insulation layer disposed above the semiconductor substrate in the cross-sectional view;
a second insulation layer disposed above the first insulation layer in the cross-sectional view; and
an inter-pixel light shielding portion disposed above the separation region in the cross-sectional view,
wherein the inter-pixel light shielding portion is at least partially disposed in the first insulation layer,
wherein the inter-pixel light shielding portion contacts the second insulation layer,
wherein a distance between a light receiving surface of the semiconductor substrate and a bottom surface of the inter-pixel light shielding portion is smaller than a width of the bottom surface of the inter-pixel light shielding portion in the cross-sectional view,
wherein the distance between the light receiving surface of the semiconductor substrate and the bottom surface of the inter-pixel light shielding portion is smaller than a width of the separation region disposed between the first photoelectric conversion portion and the second photoelectric conversion portion in the cross-sectional view, and
wherein a material of the first insulation layer is different from a material of the second insulation layer.

2. The light detecting device according to claim 1, wherein the separation region includes a trench having a width in the cross-sectional view that is smaller than the width of the bottom surface of the inter-pixel light shielding portion in the cross-sectional view.

3. The light detecting device according to claim 1, wherein the separation region includes a trench that passes through the semiconductor substrate.

4. The light detecting device according to claim 3, further comprising:
a reflecting member that reflects light and that is disposed at a location that is on a bottom surface side of the trench in a wiring layer and that is closer to the trench than wiring formed in the wiring layer, the wiring layer being stacked on a surface of the semiconductor substrate that is opposite to the light receiving surface.

5. The light detecting device according to claim 4, wherein a part of the reflecting member that is embedded in the trench is formed to be deeper than an STI (Shallow Trench Isolation) of a transistor of a pixel that includes the first photoelectric conversion portion.

6. The light detecting device according to claim 1, wherein the separation region includes a trench.

7. The light detecting device according to claim 1, further comprising:
a first lens disposed above the second insulation layer, and
a second lens disposed between the first lens and the first insulation layer.

8. The light detecting device according to claim 7, wherein the second insulation layer includes the second lens.

9. The light detecting device according to claim 1, wherein the first insulation layer includes a resin.

10. The light detecting device according to claim 1, wherein the second insulation layer includes a resin.

11. The light detecting device according to claim 1, wherein the first insulation layer contacts the second insulation layer.

12. The light detecting device according to claim 1, further comprising:
a third insulation layer disposed between the semiconductor substrate and the first insulation layer.

13. The light detecting device according to claim 12, wherein a refractive index of the third insulation layer is smaller than a refractive index of the semiconductor substrate.

14. The light detecting device according to claim 12, wherein the third insulation layer includes hafnium.

15. The light detecting device according to claim 1, wherein the inter-pixel light shielding portion includes a metal.

16. The light detecting device according to claim 1, further comprising: a film including a metal, wherein the film contacts a bottom surface of the inter-pixel light shielding portion in a cross-sectional view.

17. The light detecting device according to claim 1, further comprising:
a wiring layer disposed under a surface opposite to the light receiving surface of the semiconductor substrate.

18. The light detecting device according to claim 1, wherein the bottom surface of the inter-pixel light shielding portion is the only surface of the light inter-pixel light shielding portion facing the light receiving surface of the semiconductor substrate, and wherein the bottom surface of the inter-pixel light shielding portion lies in a single plane that is parallel to the light receiving surface of the semiconductor substrate.

19. The light detecting device according to claim 1, wherein the inter-pixel light shielding portion extends through the first insulation layer to the second insulation layer.

20. An electronic apparatus, comprising:
a light detecting device including:
a first photoelectric conversion portion and a second photoelectric conversion portion disposed in a semiconductor substrate in a cross-sectional view in a cross-sectional view;
a separation region disposed between the first photoelectric conversion portion and the second photoelectric conversion portion in the cross-sectional view;
a first insulation layer disposed above the semiconductor substrate in the cross-sectional view;
a second insulation layer disposed above the first insulation layer in the cross-sectional view; and
an inter-pixel light shielding portion disposed above the separation region in the cross-sectional view,
wherein the inter-pixel light shielding portion is at least partially disposed in the first insulation layer, wherein the inter-pixel light shielding portion contacts the second insulation layer, wherein a distance between the light receiving surface of the semiconductor substrate and a bottom surface of the inter-pixel light shielding portion is smaller than a width of the bottom surface of the inter-pixel light shielding portion in the cross-sectional view, wherein the distance between the light receiving surface of the semiconductor substrate and the bottom surface of the inter-pixel light shielding portion is smaller than a width of the separation region disposed between the first photoelectric conversion portion and the second photoelectric conversion portion in the cross-sectional view, and wherein a material of the first insulation layer is different from a material of the second insulation layer.

* * * * *